US008829460B2

(12) United States Patent
Nikolic et al.

(10) Patent No.: US 8,829,460 B2
(45) Date of Patent: Sep. 9, 2014

(54) THREE-DIMENSIONAL BORON PARTICLE LOADED THERMAL NEUTRON DETECTOR

(75) Inventors: Rebecca J. Nikolic, Oakland, CA (US); Adam M. Conway, Livermore, CA (US); Robert T. Graff, Modesto, CA (US); Joshua D. Kuntz, Livermore, CA (US); Catherine Reinhardt, Livermore, CA (US); Lars F. Voss, Livermore, CA (US); Chin Li Cheung, Lincoln, NE (US); Daniel Heineck, San Diego, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 194 days.

(21) Appl. No.: 13/552,307

(22) Filed: Jul. 18, 2012

(65) Prior Publication Data

US 2013/0075848 A1    Mar. 28, 2013

Related U.S. Application Data

(63) Continuation-in-part of application No. 13/014,879, filed on Jan. 27, 2011, now Pat. No. 8,314,400, which is a continuation-in-part of application No. 11/414,288, filed on Apr. 27, 2006, now abandoned.

(60) Provisional application No. 61/508,992, filed on Jul. 18, 2011, provisional application No. 60/675,654, filed on Apr. 27, 2005, provisional application No. 61/509,023, filed on Jul. 18, 2011.

(51) Int. Cl.
*G01T 3/00* (2006.01)
*H01L 31/08* (2006.01)
*H01L 31/18* (2006.01)
*G01T 3/08* (2006.01)

(52) U.S. Cl.
CPC .............. *H01L 31/085* (2013.01); *H01L 31/18* (2013.01); *G01T 3/08* (2013.01)
USPC ...................................................... 250/390.01

(58) Field of Classification Search
CPC .......... G01T 3/08; H01L 31/085; H01L 31/18
USPC ........................................ 250/390.01–390.12
See application file for complete search history.

(56) References Cited

U.S. PATENT DOCUMENTS

| | | | | |
|---|---|---|---|---|
| 4,941,942 A * | 7/1990 | Bruns et al. | ........................ | 216/2 |
| 6,727,504 B1 * | 4/2004 | Doty | ........................ | 250/390.01 |
| 6,867,444 B1 * | 3/2005 | Hughes | ........................ | 257/252 |

(Continued)

OTHER PUBLICATIONS

Deo, N., et al., "Conformal filling of silicon micropillar platform with 10boron", J. Vac. Sci. Technol., B 26, 4, 2008, pp. 1309-1314.

(Continued)

*Primary Examiner* — Kiho Kim
(74) *Attorney, Agent, or Firm* — John P. Wooldridge

(57) ABSTRACT

Three-dimensional boron particle loaded thermal neutron detectors utilize neutron sensitive conversion materials in the form of nano-powders and micro-sized particles, as opposed to thin films, suspensions, paraffin, etc. More specifically, methods to infiltrate, intersperse and embed the neutron nano-powders to form two-dimensional and/or three-dimensional charge sensitive platforms are specified. The use of nano-powders enables conformal contact with the entire charge-collecting structure regardless of its shape or configuration.

30 Claims, 10 Drawing Sheets

(56) References Cited

U.S. PATENT DOCUMENTS

2003/0214699 A1* 11/2003 Banin et al. ............... 359/333
2004/0241991 A1* 12/2004 Aoyama et al. ............ 438/689
2005/0258372 A1* 11/2005 McGregor et al. ....... 250/390.01

OTHER PUBLICATIONS

Gersch, H., et al., "The effect of Incremental gamma-ray doses and incremental neutron fluences upon the performance of self-biased 10B-coated high-purity epitixial GaAs thermal neutron detectors", Nuclear Instruments and Methods in Physics Research, A 489, 2002, pp. 85-96.

McGregor, D.S., "New Surface Morphology for Low Stress Thin-Film-Coated Thermal Neutron Detectors", IEEE Transactions on Nuclear Science, vol. 49, No. 4, 2002, pp. 1999-2004.

McGregor, D.S., et al., "Thin-film coated bulk GaAs detectors for thermal and fast neutron measurements", Nuclear Instruments in Physics Research, A 466, 2001, pp. 126-141.

Nikolic, R.J., et al., "6:1 aspect ratio silicon pillar based thermal neutron detector filled with 10B", American Institute of Physics, Applied Physics Letters, 93, 2008, pp. 93-95.

Nikolic, R.J., et al., Fabrication of Pillar-Structured Thermal Neutron Detectors, IEEE Nuclear Science Symposium Conference, 2007, pp. 1577-1580.

Nikolic, R.J., et al., "Roadmap for High Efficiency Solid-State Neutron Detectors", Proc. of SPIE, vol. 6013, 2005, 9 p.

Osberg, K., et al., "A Handheld Neutron-Detection Sensor System Utilizing New Class of Boron Carbide Diode", IEEE Sensors Journal, vol. 6, No. 6, 2006, pp. 1531-1538.

Ricceri, R., et al., "Mechanochemical synthesis of Elemental Boron", Engineering & Technology, The Int'l Journal of Powder Metallurgy, vol. 39, No. 3, 2003, pp. 48-52.

Shultis, J.K., et al., "Efficiencies of Coated and Perforated Semiconductor Neutron Detectors", IEEE Transactions on Nuclear Science, vol. 53, No. 3, 2006, pp. 1659-1665.

* cited by examiner

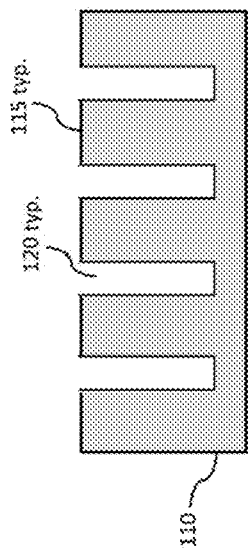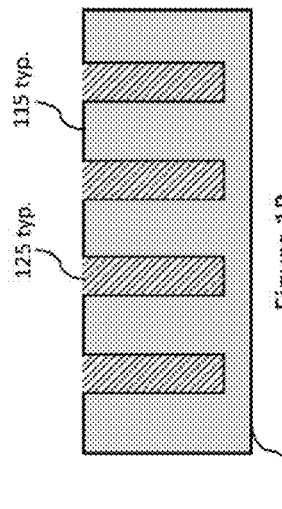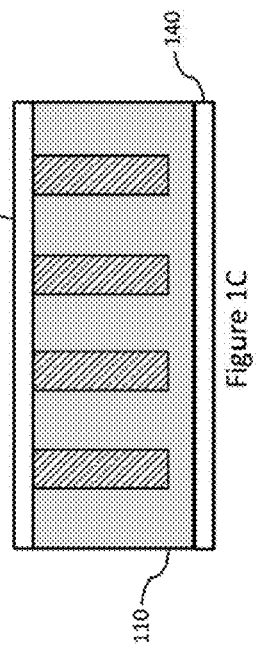

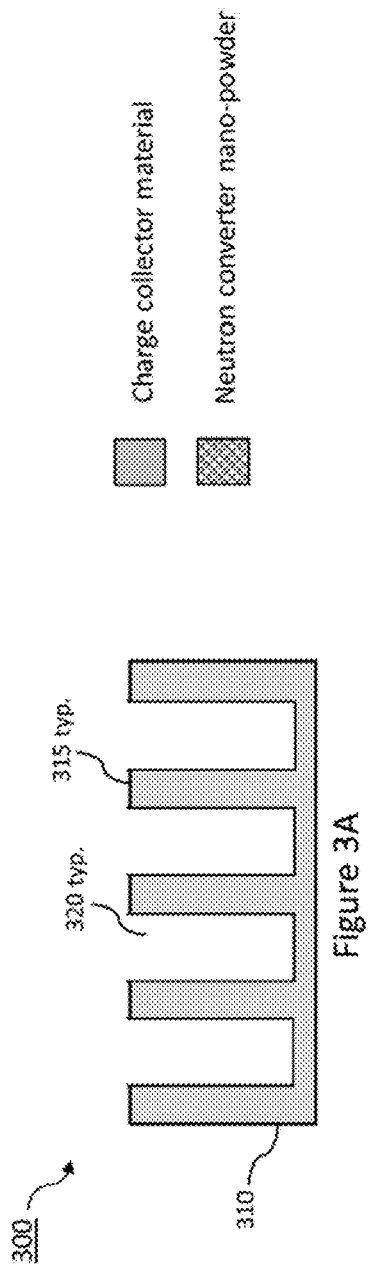
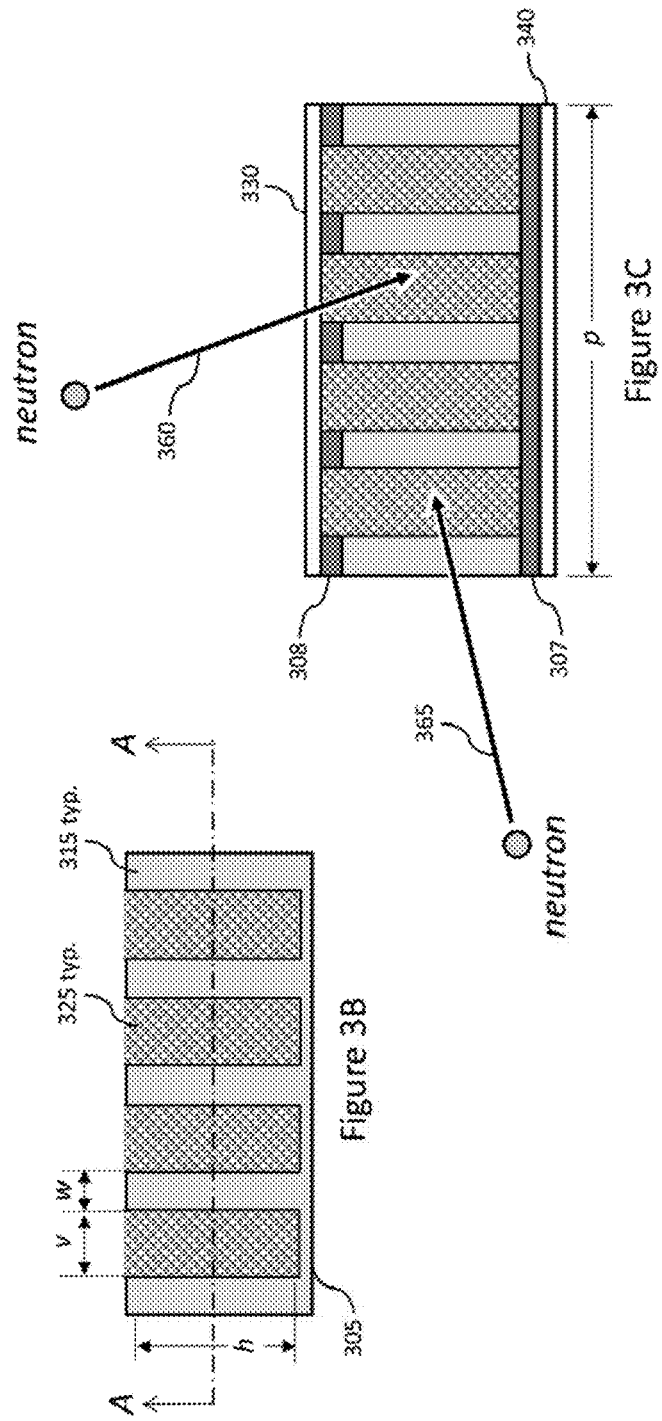

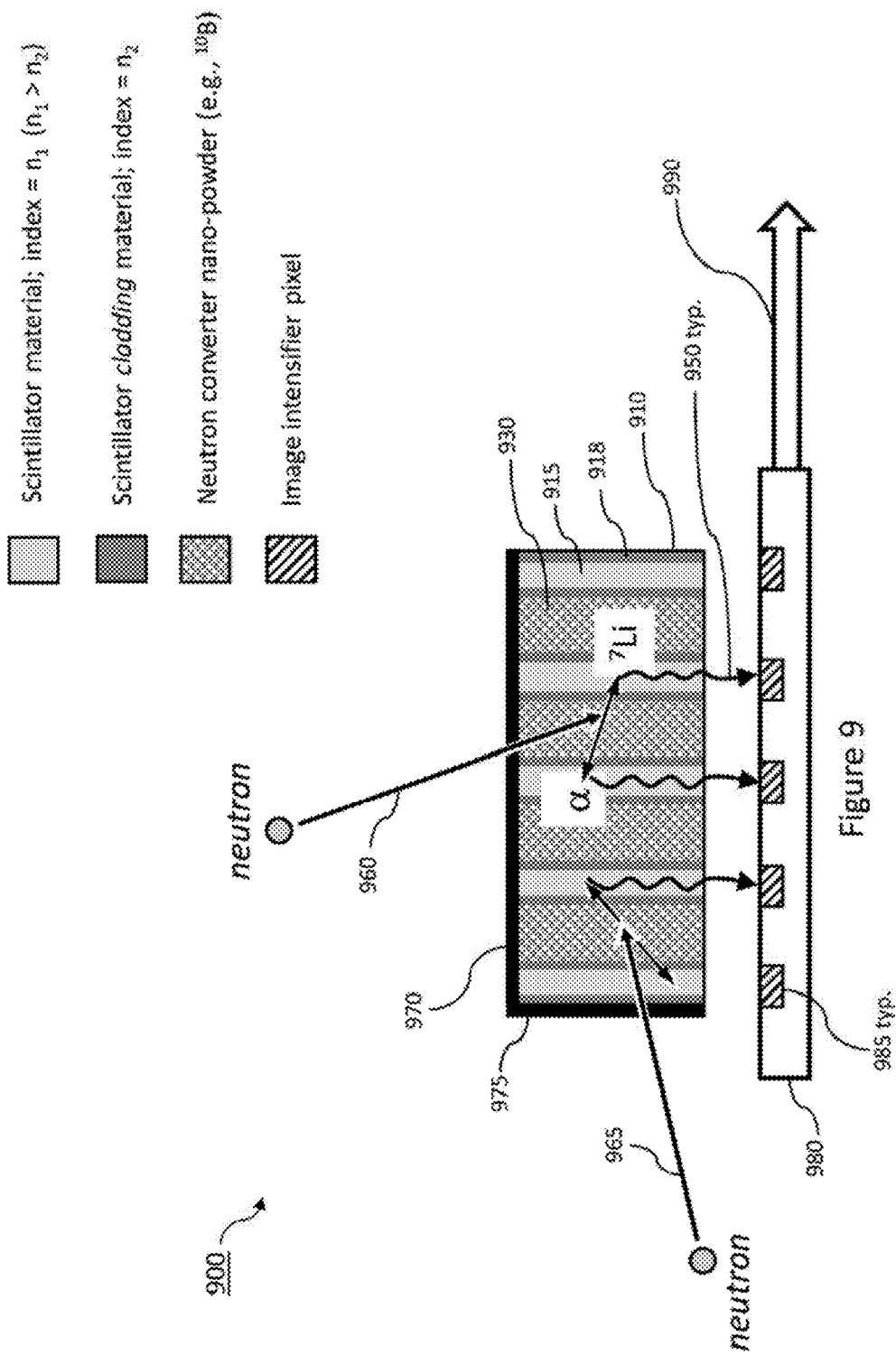

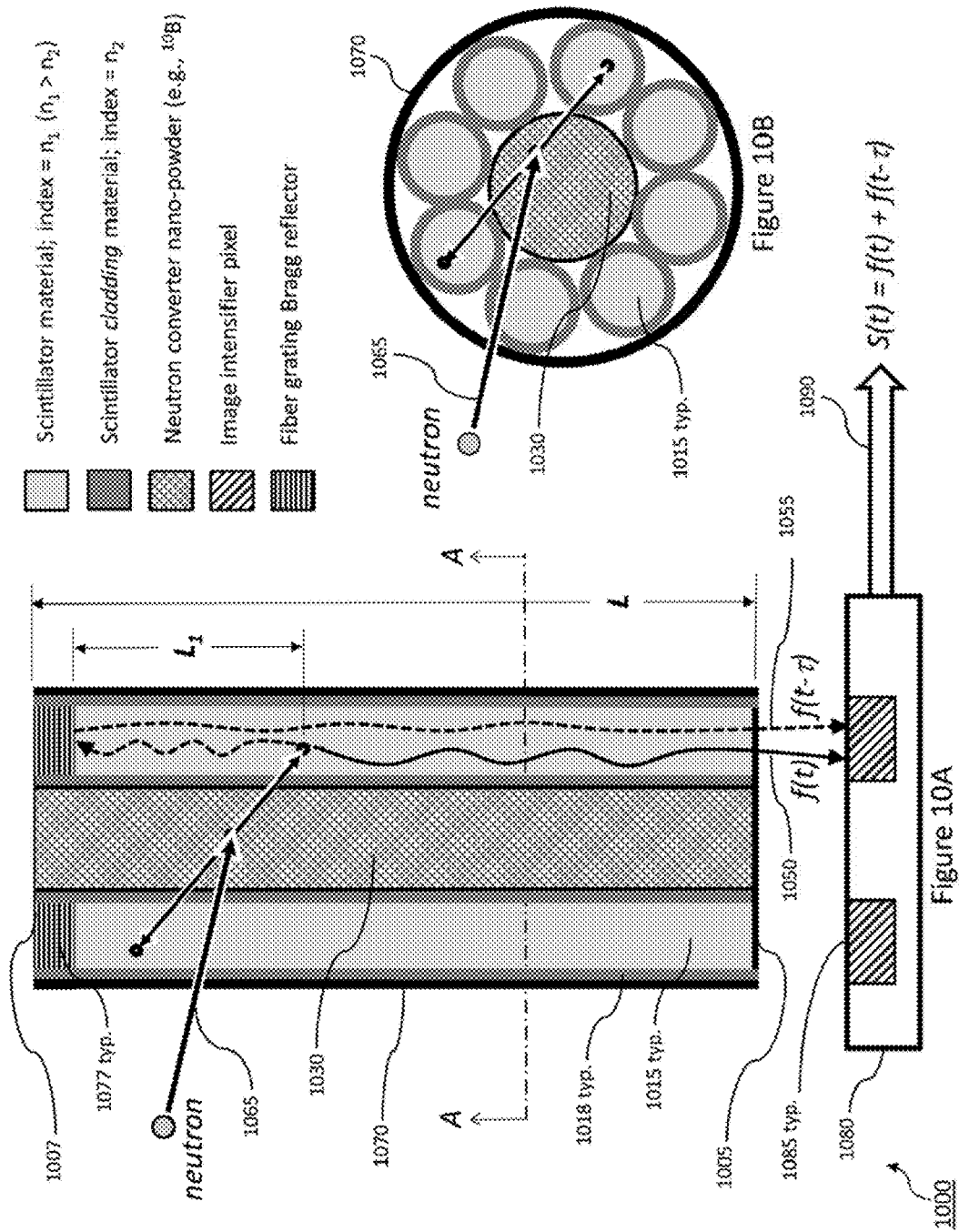

THREE-DIMENSIONAL BORON PARTICLE LOADED THERMAL NEUTRON DETECTOR

CROSS-REFERENCE TO RELATED APPLICATIONS

This application claims the benefit of U.S. Provisional Patent Application No. 61/508,992 titled "Three-Dimensional Boron Particle Loaded Thermal Neutron Detector," filed Jul. 18, 2011, incorporated herein by reference. This application is a Continuation in Part of U.S. patent application Ser. No. 13/014,879, titled "Method to Planarize Three-Dimensional Structures to Enable Conformal Electrodes," filed Jan. 27, 2011, incorporated by reference. U.S. patent application Ser. No. 13/014,879 claims priority to U.S. provisional No. 61/509,023, filed Jul. 18, 2011, incorporated herein by reference. U.S. application Ser. No. 13/014,879 is a continuation-in-part of U.S. patent application Ser. No. 11/414,288, titled "Semiconductor Materials Matrix for Neutron Detection," filed Apr. 27, 2006, incorporated herein by reference. U.S. patent application Ser. No. 11/414,288 claims priority to U.S. Provisional Patent Application Ser. No. 60/675,654, titled "Semiconductor Nano-Materials Matrix for Neutron Detection," filed Apr. 27, 2005, incorporated herein by reference.

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

1. Field of the Invention

The present invention relates to thermal neutron detectors, and more specifically, it relates to improvements in the detectors as well as improved fabrication techniques.

2. Description of Related Art

Solid-state thermal neutron detectors are required for a variety of applications, particularly, nonproliferation of special nuclear material (SNM). The currently used technology involves $^3$He tubes, which have a variety of shortcomings when utilized in the field as thermal neutron detectors, including the need for high-voltage operation, sensitivity to microphonics, and large size. Moreover, the limit of the world's supply of $^3$He presents yet another set of critical issues related to strategic and tactical implications, which are of practical importance.

A variety of monolithic solid-state thermal neutron detectors have been proposed. A commonly used geometry involves the use of a planar semiconductor detector over which a neutron reactive film has been deposited. Upon a surface of the semiconductor detector is attached a coating that releases ionizing radiation reaction products upon interaction with a neutron. The ionizing radiation reaction products can then enter into the semiconductor material of the detector, thereby creating a charge cloud of electrons and holes, which can be sensed to indicate the occurrence of a neutron interaction within the neutron sensitive film. The charges are swept through such configured detectors via methods known by those of ordinary skill in the art and registered as an electrical signal.

Present technology for radiation detection suffers from flexibility and scalability issues. Since neutrons have no charge and do not interact significantly with most materials, special neutron converters in solid form have been used to react with neutrons and generate charged particles that can be easily detected by semiconductor devices to generate electrical signals. As an example, the neutron sensitive materials may include Boron and various compounds thereof, such as, $^{10}$Boron; or a compound containing $^{10}$Boron, such as natural Boron, natural Boron Carbide, $^{10}$Boron Carbide, or $^{10}$Boron Nitride. Other classes of neutron sensitive materials include, but are not limited to, Lithium (e.g. pure $^6$Lithium; or a compound containing $^6$Lithium such as $^6$Lithium Fluoride), $^{155}$Gadolinium, or $^{157}$Gadolinium. Charge collecting materials may include semiconductors (e.g., Si, Ge, etc.) and alloys thereof (e.g., GaAs, InP, etc.), as well as organic semiconductors.

The prior art has been limited to various thin-film, monolithic structures for the detection of thermal neutrons. As an example, one class of solid-state neutron detector is in the form of a planar structure. This device is comprised of a single thin-film layer of the neutron sensitive material, grown onto a semiconductor substrate and, is hence, limited to low detection efficiencies. Beyond single-layer structures, various 2D and 3D designs of detector geometries to collect the generated electron-hole pairs are also being pursued. Thin-film techniques to deposit the neutron sensitive material onto or in the charge collecting material have included e-beam evaporation and chemical vapor deposition.

The prior art is also limited to structures in which the charge-collecting platform and the neutron-sensitive material are well suited for typical fabrication techniques that can support both sets of materials, possibly simultaneously. Hence, the prior art involves the fabrication of, and is limited to, monolithic structures. That is, the monolithic structures must be amenable to existing deposition techniques and materials that are compatible with each other.

Moreover, the choice of working materials using the prior art is constrained to be compatible within a given deposition system so that it can concomitantly employ the desired neutron-sensitive compounds as well as the solid-state semiconductor. As an example, certain neutron-sensitive materials may not be amenable with existing-thin-film deposition systems (vapor, plasma, chemical, epitaxial, etc.), by virtue of differential vapor pressures, deposition temperatures, toxicity, corrosion, radioactivity, contamination, as well as safety issues.

Examples of prior art sensors include fiber optic scintillometers combined with various neutron-sensitive materials, including fibers coated thin layers of equivalent "doped paint," as well as fiber matrices immersed in doped paraffin or liquids that surround the fibers. In all these prior-art embodiments, the neutron-sensitive material is utilized as a dopant in a liquid or solid, thereby limiting the density of the desired material.

Finally, the prior art involves material compatibility issues, both during device fabrication, and, furthermore, during the in-field usage of the sensor over its expected lifetime. Thin-film material constraints can limit the classes of materials and more importantly the quality of the material, owing to differences and effects in the pressure and temperature during the process. For many vacuum system processes (sputtering, electron beam evaporation and CVD) the material will be coated in a line of sight configuration which can be difficult to coat high aspect ratio structures due to shadowing. For a low pressure vacuum CVD with optimized temperature the coating can be conformal and completely fill a high aspect ratio structure but can suffer from undue stress in the material composite which can lead to material delamination and material cracking.

SUMMARY OF THE INVENTION

The present invention circumvents the prior art design rule constraints and compatibility issues because the component materials can assemble independently, under conditions that are optimized for each respective fabrication step. Key features of this invention include its relatively low-cost and simplicity (compared to electron beam evaporation, chemical vapor deposition, and sputtering which require vacuum chambers), and furthermore, that the fabrication process is compatible with "batch processing" modalities. As an example, the charge-collecting solid structure can be fabricated independently, utilizing photolithography and etching. The present invention teaches methods to enhance the efficiency of two-dimensional and three-dimensional, solid-state thermal neutron detectors. Specifically, the present invention utilizes neutron sensitive conversion materials in the form of nano-powders and micro-sized particles, as opposed to thin films, suspensions, paraffin, etc. More specifically, methods to infiltrate, intersperse and embed the neutron nano-powders to form two-dimensional and/or three-dimensional charge sensitive platforms are specified. The use of nano-powders enables conformal contact with the entire charge-collecting structure regardless of its shape or configuration.

The present invention therefore enables combinations of neutron-sensitive materials which can be entirely dissimilar on a microscopic level. Thus, the design rules can be relaxed significantly, so that the performance of the sensor can be independently optimized as a function of the material constituents, essentially free of the myriad constraints of the processing and/or fabrication systems. As a further example, the charge collecting structure can be passivated using techniques that would have otherwise been intractable in the prior art, given its processing constraints. Hence, deleterious effects such as surface recombination of charge carriers can be addressed during the processing of the basic structure, prior to and independent of the neutron conversion material fabrication step.

In addition, the present invention also enables novel charge-collecting materials to be utilized. As an example, beyond conventional solid-state semiconductor structures, the present invention enables non-crystalline media to be utilized, such as organic semiconductors. This can result in large-area low-cost flexible structures, using a variety of processing techniques. Moreover, pixelated neutron sensors can be realized by employing processing techniques not unlike those used in the fabrication of large-area displays and biosensor arrays.

The present invention is not necessarily a monolithic structure. The present device can comprise a solid-state material as one component and a granular species as a second component. In certain embodiments, the present invention can be defined as a hybrid monolithic structure, in that the semiconductor charge-collecting constituent can be fabricated as a monolithic structure, but when combined with a granular/powdery component, the resultant device is, by definition, no longer limited to a monolithic structure.

Beyond sensing the presence of the neutron-induced charged-particle byproducts via electronic means, this invention also teaches embodiments that enable the detection of thermal neutrons via optical emission processes. In this case, similar neutron sensitive materials can be utilized in the form of micro and nano powders (as in the case of the charge-collecting embodiments), but instead of electronic means for signal detection, the presence of ionizing particles is detected using optical scintillation materials. In these embodiments, the neutron-mediated charged particles interact in the scintillometer media to produce photons as a result of ionization and photon emission processes, typical of scintillometers. The photons are subsequently detected using arrays of photodetectors, PMTs, avalanche photodiode arrays (in the Geiger-mode, as an example) and/or image intensifiers. The prior art in this technology includes neutron sensitive materials interspersed with a matrix comprised of fiber optic scintillometers (FOS). These structures enable passive sensors to be realized (since the photon detectors can be placed on a different platform) and, furthermore, result in high-speed sensor performance with minimal dead-time.

Examples of prior art sensors include fiber optic scintillometers combined with various neutron-sensitive materials, including fibers coated thin layers of equivalent "doped paint," as well as fiber matrices immersed in doped paraffin or liquids that surround the fibers. In all these prior-art embodiments, the neutron-sensitive material is utilized as a dopant in a liquid or solid, thereby limiting the density of the desired material.

In the present invention, the low-level doped materials are replaced by neutron converters in the form of micro and nano powders. The use of powders enables high fill factors to be realized within the fiber optic matrix. Moreover, the solubility constraints of liquids and paraffins, which can otherwise limit the concentration and density of the desired neutron converter materials, as well as its uniformity, are obviated by the use of powders. This can result in a compact, rugged sensor, with superior detection performance. The class of nano-powder/FOS can be configured into any shape. Hence, in situ sensors can be integrated into nuclear reactors during manufacture for health monitoring applications, as well as into UAVs (airborne, underwater, etc.) to enable neutron measurements to be made under adverse conditions.

In general, the performance of the thermal neutron detector is a function of the detailed detector dimensions, aspect ratios, materials and sensor geometry. In the case of a detector comprised of an array of pillars of charge-collecting material interspersed with neutron conversion material, the thermal neutron detection efficiency can scale with the pillar height and inversely with pillar width. Given the myriad constraints of monolithic processing techniques, the design rules governing the fabrication of such sensors (e.g., overall dimensions, aspect ratios, etc.), can be highly constrained. It is a goal of this patent to optimize the sensor performance by relaxing existing design-space constraints inherent in the prior art. It is a further goal of this patent to enable novel materials to be considered for enhanced sensor performance, which would otherwise be ruled out as candidate media, owing to material compatibility issues and limitations when fabricating monolithic devices using thin-film deposition processing techniques.

In what follows, we first describe prior art embodiments (using thin-film fabrication techniques) that pertain to thermal neutron detectors using electronic readout modalities, using, as an example, charge-carrier structures such as semiconductors. This is followed by a discussion of neutron-conversion materials that employ nano-powders in place of thin-films, including preparation methods and dispersal techniques to disperse the nano-powders into charge-carrier matrices. Next, embodiments that extend the utility of thermal neutron detectors from a single-pixel device to a 2-D imaging detector, the latter with video readout capability are discussed. This is followed by a discussion of embodiments that enable optical readout of the neutron events to be realized using scintillometer materials as support structures (in place of the charge-carrier approaches). Single-pixel and 2-D video imaging approaches are discussed using the optical readout modalities.

Finally, the extension of a single element neutron detector to a long, distributed, flexible sensor, using optical readout, is described. Such distributed, fiber-based sensors can be woven screen-like sheets and conformally configured to surround a given workpiece under evaluation. Lastly, owing to the fact that the optical sensor embodiments are inexpensive, lightweight, covert and non-metallic, these sensors can be submerged for underwater neutron detection and monitoring applications for a variety of specialized applications.

BRIEF DESCRIPTION OF THE DRAWINGS

The accompanying drawings, which are incorporated into and form a part of the disclosure, illustrate embodiments of the invention and, together with the description, serve to explain the principles of the invention.

FIG. 1A depicts a prior-art, thermal neutron sensor structure, consisting of a monolithic substrate of semiconductor material, with an array of high-aspect ratio pillars with cavity regions etched between the pillars.

FIG. 1B depicts the prior-art monolithic sensor structure of FIG. 1A, whose cavities regions are filled with a suitable a neutron-conversion material.

FIG. 1C depicts the prior-art structure of FIG. 1B, complete with conformal electrodes deposited on opposing surfaces forming a compact, monolithic thermal neutron sensor.

FIG. 3A depicts an embodiment of a thermal neutron sensor structure, consisting of a substrate, comprised of charge-carrier generating semiconductor material, configured as an array of high-aspect ratio pillars, with cavity regions etched between the pillars.

FIG. 3B depicts the sensor structure of FIG. 3A, whose cavities regions are filled with a suitable neutron-conversion material, in the form of micro-powders or nano-powders, which can contain various mixtures of different constituent compounds, suitable for a given application.

FIG. 3C depicts the structure of FIG. 3B, complete with highly doped layers, upon which conformal electrodes are deposited on opposing surfaces, forming a compact, rugged thermal neutron sensor.

FIG. 9 depicts an embodiment of a thermal neutron sensor structure, consisting of a substrate, comprised of a photon generating scintillometer material, configured as an array of high-aspect ratio pillars, with cavity regions filled with suitable nano-powders or mixtures thereof.

FIG. 10A depicts a distributed neutron detector with optical readout.

FIG. 10B depicts a cross-section view corresponding to the sectional cut A-A through the sensor structure of FIG. 10A. The neutron interacts with the distributed sensor by impinging the device normal to the long axis of the fiber structure (i.e. from the side).

DETAILED DESCRIPTION OF THE INVENTION

Figure 2:
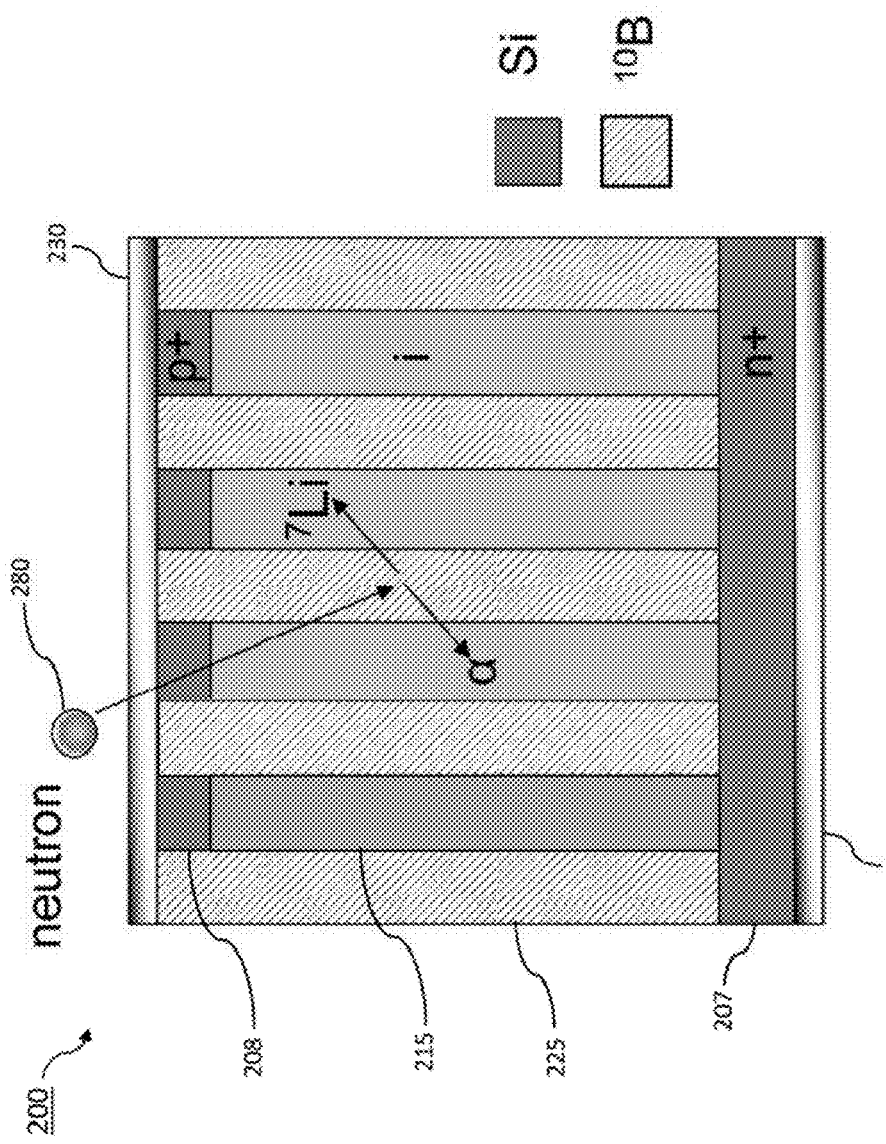
FIG. 2 shows a schematic of a prior-art pillar-structured, solid-state thermal neutron detector.

U.S. patent application Ser. No. 13/014,879 by the same inventors, teaches exemplary detector structures, as fabricated using thin-film deposition techniques, of thermal neutron detectors using electronic-based methods for the sensor readout, and involves a two-component monolithic platform, comprised of a neutron interaction region (such as $^{10}$B), interspersed within an array of pillar structured p-i-n semiconductor diodes. In this prior art, the overall detector is formed as a rugged monolithic structure. That is, embodiments of the p-i-n diode-array of pillars and the neutron conversion layers are fabricated using thin-film deposition techniques.

Such highly constrained design rules limit the charge-collecting and neutron conversion materials to those that are compatible with each other, in terms of thin-film layer compatibility and adhesion, as well as to thin-film growth processes. Moreover, the approach limits the scale sizes of the constituent elements of the detector, in terms of overall size, aspect ratio, mechanical stability, and well-depth limitations, the latter limited by deleterious shadowing effects during deposition.

The prior basic pillar-based thermal neutron detector is shown in FIG. 1A, FIG. 1B and FIG. 1C. A schematic drawing of a general three-dimensional neutron detector structure 100, in cross section, is shown in FIG. 1A. It consists of substrate 110, etched or otherwise formed into an array of pillars, 115, with inter-dispersed cavity regions (e.g., gaps) between the pillars. This basic structure functions as the charge-collecting component of the overall detector. A shown in FIG. 1B, the cavity regions, 120, are filled with a suitable material, 125, which can differ from that of the substrate material, and which functions as the neutron conversion component of the sensor. Thin-film techniques are utilized to deposit the neutron interaction material 125 in the cavity regions 120. Typically, the lower portion 105 of structure 100, depicted in FIG. 1B, consists of a single material, typically a semiconductor, such as Si, GaAs, etc, which forms the substrate of the overall structure. The upper surface of structure 100 consists of several different materials, whose mechanical and compositional properties can differ in general. Inter-dispersed in the cavity regions, 120, between the semiconductor pillars is a second material 125, as shown in FIG. 1B. This second material 125, in the case of a thermal neutron detector, can consist of $^{10}$B. The aspect ratio of the structure, namely, the ratio of the height of the pillars relative to its width and/or pitch can vary from about 1:1 to 1000:1. For thermal neutron detection, the aspect ratio is in the range of 10:1 to 100:1; the pitch as well as the pillar cross section dimension is in the range 1 to 10 μm, and the pillar height is in the range of 10 μm to 100 μm.

As shown in FIG. 1C, electrical contact to the detector consists of upper and lower conductive layers, 130 and 140, respectively, that bound the active region of the sensor. In order to realize functionality and reliability of such three-dimensional structures, it is necessary to deposit a global electrical contact, interconnecting the tops of the pillar-arrayed structure. The prior art teaches several processing techniques to form electrodes reliably. Preferred processing techniques to circumvent otherwise detrimental non-uniform morphology, including planarization techniques to provide a robust, contiguous and conformal electrode across the upper surface of the pillared structure, are discussed in the prior art.

It is important to emphasize that the prior devices are highly constrained, in that the materials that comprise the supporting structure and the neutron-conversion media must be compatible with, and amenable to, thin-film processing fabrication techniques. This follows, since the prior art teaches a monolithic, rigid structure, and more specifically, teaches thin-film processing methods to fabricate the overall detector. This limits the materials, and compounds thereof, to those that are compatible with each other, as well as restricts materials to those that retain their chemical composition during and following the thin-film growth processes.

An example of a completed prior thermal neutron detector, 200, is shown in FIG. 2. This sensor is fabricated as a monolithic structure, comprised of a charge-carrier interaction substrate and pillars 215 (e.g., Si), whose cavities are filled with a suitable neutron-sensitive converter material 225 (e.g., $^{10}$B), deposited into the cavity regions, using as an example, thin-film deposition techniques, as discussed above. The semiconductor pillars and substrate of the overall structure are designed to function as an array of p-i-n diodes, in a parallel-circuit configuration. Each respective p-i-n diode consists of a pillar, comprised of intrinsic Si 215, a lower region that consists of an n+ layer 207, and an upper region of each Si pillar 215 that consists of a p+ layer 208. The upper and lower surfaces are planarized, per the prior art, with electrodes 230 and 240 deposited on each respective surface, thereby forming the overall neutron detector.

FIG. 2 also depicts an example of a typical neutron event and its interaction with the detector. Owing to the high neutron interaction cross section with $^{10}$B, the incident neutrons 280 interact primarily in the filled $^{10}$B regions 225 in the detector. The resultant products of this key interaction channel include $^7$Li and an alpha particle (α), as shown in the figure. The alpha particles subsequently interact (via ionization processes) in the neighboring intrinsic Si regions 215, giving rise to electron-hole pairs, whose resultant current is sensed across electrodes 230 and 240.

U.S. application Ser. No. 13/456,182 also teaches methods to discriminate against undesirable events that would otherwise lead to false alarms. An example of an undesirable event (not shown) is the interaction of a gamma ray with the detector, which can give rise to an electron-hole pair by direct interaction within the Si pillar, and result in a deleterious false alarm rate. This problem is addressed with the result that the performance of the sensor is optimized in detecting the desired species (e.g., thermal neutrons), while discriminating against competing events (e.g., gamma rays). The design and fabrication of such an enhanced detector is the subject of co-pending U.S. patent application Ser. No. 13/456,182, incorporated herein reference.

An embodiment of the basic device structure 300 of the present invention is depicted in FIG. 3A, FIG. 3B and FIG. 3C. The basic configuration of the charge-collecting structure is chosen to be similar to that of FIG. 1. However, it is to be noted that, given the freedom from the thin-film constraints of the prior art, novel, arbitrarily shaped sensors can be realized (beyond that depicted in FIG. 3A), with an extended range of sensor aspect ratios.

A schematic drawing of a general three-dimensional neutron detector structure 300, in cross section, is shown in FIG. 3A and FIG. 3B. It consists of substrate 310, etched to form an array of pillars, 315, each of width, w, with inter-dispersed cavity regions (e.g., gaps), 320, between the pillars. This basic structure functions as the charge-collecting component of the overall detector. The cavity regions, 320, are filled with a suitable material, 325, which can differ from that of the substrate material, and which functions as the neutron conversion component of the sensor.

The neutron conversion material 325 is in the form of a nano-powder or a micro-powder of neutron-sensitive conversion media. The preparation of these powders, as well as methods to disperse the powders into the pillar matrix, are discussed in the sections that follow.

Typically, the lower portion 305 of structure 300, as depicted in FIG. 3B, consists of a charge sensitive material, typically a semiconductor, such as Si, Ge, GaAs, InP, SiC, GaN, etc, which forms the substrate of the overall structure. The upper surface of structure 300 consists of several different materials, whose mechanical and compositional properties can differ in general. Inter-dispersed in the cavity regions, 320, between the semiconductor pillars is a second material 325, as shown in FIG. 3B. This second material 325, in the case of a thermal neutron detector, can consist of one or more materials, such as $^{10}$B, B, $^{10}$B$_4$C, B$_4$C, $^{10}$BN, Gd, LiF, Li, $^6$LiF, $^6$Li, etc. The aspect ratio of the structure, namely, the ratio of the height of the pillars relative to its width and/or pitch can vary from about 1:1 to 1000:1. For thermal neutron detection, the aspect ratio is in the range of 10:1 to 100:1; the pitch of the periodic structure, as well as the width of the pillars, are in the range 1 to 10 μm, and the pillar height is in the range of 10 μm to 100 μm or more. The detector efficiency typically improves for increased pillar heights, as the detector provides a longer neutron interaction length within the converter material(s). Cross-sectional cut A-A in FIG. 3B enables one to view the sensor from above, and is the topic of FIG. 4 below.

As shown in FIG. 3C, upper and lower conductive layers, 330 and 340 respectively, make electrical contact to the detector. In order to realize functionality and reliability of such three-dimensional structures, it is necessary to deposit a global, continuous electrical contact, interconnecting the tops of the entire pillar-arrayed structure. The electrode have to at least touch the tops of the pillars. The prior art teaches several processing techniques to form electrodes reliably, as well as the n$^+$ and p$^+$ layers, 307 and 308, respectively. Preferred processing techniques to circumvent otherwise detrimental non-uniform morphology, including planarization techniques to provide a robust, contiguous and conformal electrode across the upper surface of the pillared structure, are discussed previously.

Note that, in FIG. 3C, there are two basic sensor orientations with respect to the propagation direction of an incident neutron beam. In one case, the neutron beam 360 is incident upon the sensor in a direction essentially normal to the plane of the substrate and electrodes (i.e., impinging the "top" of the sensor). This configuration is similar to that of the prior art device (recall, FIG. 2). In this case, the height, h (as indicated in FIG. 3B), of the pillar (or ridge) matrix 315 defines the neutron interaction length in the given conversion material (e.g., $^{10}$B) to produce neutron products (e.g., $^{7}$Li and α). Furthermore, the width, w (as indicated in FIG. 3B), of each charge-collecting pillar (or ridge) defines the interaction length within a given Si pillar to produce charge carriers in the semiconductor, via ionization of either $^{7}$Li or α. (It is assumed that the charge-carrier interaction cross section in the semiconductor is much greater than that of the conversion material.)

In the second neutron beam orientation shown in FIG. 3C, the neutron beam 365 is incident upon the sensor in a direction essentially parallel to the plane of the substrate and electrodes, of total length, p (i.e., impinging the "side" of the sensor). In this case, the thickness, v, of each neutron conversion layer defines the neutron interaction length in each given conversion material layer (e.g., $^{10}$B). On the other hand, the width of each charge-collecting pillar (or ridge), w, is a function of the charge-carrier interaction length (as in the first case above). The height of the pillars (or ridges) in this case is inconsequential, insofar as the magnitude of interaction lengths is concerned, and, instead, is limited only by the carrier lifetime (typical of semiconductor devices in general).

Figure 4A:
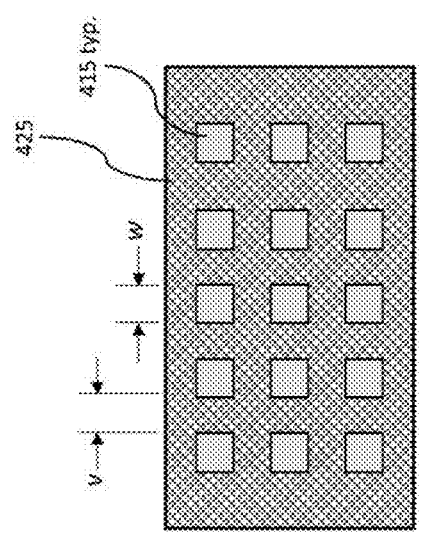
FIG. 4A shows a view based on a cross-sectional cut A-A through the sensor, as drawn in FIG. 3B, in the case of a two-dimensional rectangular array of long pillars, with each pillar possessing a square cross section.
Figure 4B:
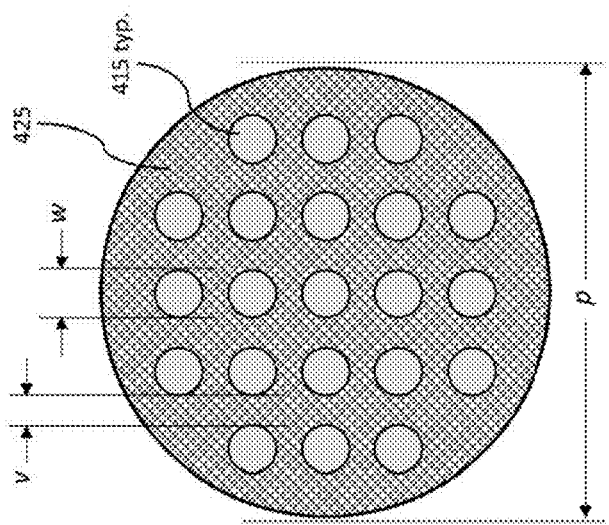
FIG. 4B shows a view based on a cross-sectional cut A-A through the sensor, as drawn in FIG. 3B, in the case of a two-dimensional circular array of long pillars, with each pillar possessing a circular cross section.
Figure 4C:
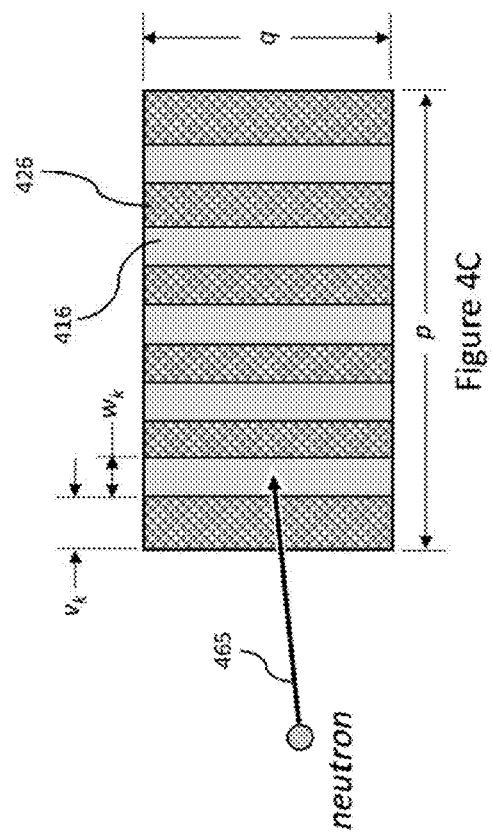
FIG. 4C shows a view based on a cross-sectional cut A-A through the sensor, as drawn in FIG. 3B, in the case of a two-dimensional rectangular array of long ridges, with each ridge possessing a rectangular cross section.

Turning now to FIG. 4A, FIG. 4B and FIG. 4C, three embodiments of the present invention are shown. Each figure corresponds to a cross-sectional view A-A of the device depicted in FIG. 3B, as viewed from above the detector. In all cases, the pillars and ridges are comprised of a charge-collecting material, typically, a semiconductor. The overall length of the sensor (or, in the case of FIG. 4B, the diameter), is given as p; whereas, the total width is given as q. These embodiments are derived from FIG. 3B, with the cross sectional cut taken horizontally across the device. The overall device can be of a rectangular (or, square) cross section, as in FIG. 4A and FIG. 4C; or, can be circular in cross section, as in FIG. 4B. Moreover, the vertical array of pillars 415 can be square or round in cross section, each of scale length, w, as shown in FIG. 4A and FIG. 4B, respectively.

The vertical structure can also be in the form of an array of parallel ridges, 416, as shown in FIG. 4C. In this case, each ridge can, in general be of a different thickness, $w_k$ (for the $k^{th}$ ridge), along the detector of total length, p, which corresponds to the case of the neutron propagation path 465, as indicated in FIG. 4C.

As shown in FIG. 4A and FIG. 4B, interspersed in the vertical pillar matrix array is a neutron conversion material, 425, which is typically in the form of a micro-powder or nano-powder, and of layer thickness, v. In the case of the ridge array in FIG. 4C, each nano-powder layer can, in general, be of a different thickness, $v_k$, for the $k^{th}$ layer along the detector length, p. Details underlying the preparation of the candidate powders, as well as the fabrication of neutron sensors using these powders, are discussed below.

In these cross-sectional views, the above three figures correspond to a top view of the given sensor configurations. As such, the neutron beam is typically incident normal to the page, as shown previously by beam 360 in FIG. 3C. In this case, the overall sensor aperture is defined by the dimensions, p and q, in the cases of FIG. 4A and FIG. 4C; and, by the diameter, p, as in FIG. 4B.

In addition to this typical beam alignment, the neutron beam 465 in FIG. 4C can also be incident from the "side" of the sensor, (which also corresponds to the neutron beam 365 in FIG. 3C). This alternate configuration enables independent sensing of the neutron interaction as it propagates through each conversion layer sequentially.

A neutron spectrometer embodiment can be realized by using the ridge structure (FIG. 4B) and orienting the neutron beam 465 to impinge upon the side of the ridge-array sensor. By measuring the induced charge-carrier current in each ridge individually, spectroscopic information can be obtained. This follows, since a neutron interaction in a given layer of nano-powder material (say, the $k^{th}$ layer), will result in an ionizing interaction in the nearest-neighbor charge-carrier ridge (say, the $k^{th}$ ridge and/or the $(k+1)^{th}$ ridge). The signal output of each ridge, therefore, can provide information along the beam path, as the neutron propagates sequentially through the ridge array. Hence, for this spectroscopic embodiment, each layer effectively performs the function of an individual sensor. Therefore, the physical thickness ($v_k$) of each nano-powder layer and its respective composition can be designed to match the specific parameters of the incident beam 465 to be characterized. As an example, each layer of nano-powder can consist of a different layer thickness ($v_k$) and of a different mixture density or compound of neutron-converter materials comprised of, as an example, $^{10}$Boron; or a compound containing $^{10}$Boron, such as natural Boron, natural Boron Carbide, $^{10}$Boron Carbide, or $^{10}$Boron Nitride, Lithium (e.g. pure $^{6}$Lithium; or, a compound containing $^{6}$Lithium such as $^{6}$Lithium Fluoride), $^{155}$Gadolinium, or $^{157}$Gadolinium.

In summary, the ridge-structure of FIG. 4C can result in a custom designed spectrometer (for neutrons and/or other species), so that the electrical signals from each charge-collecting ridge can unique detector characteristics for one or a variety of interacting particles. In order to measure the electronic response of each ridge, a pixelated, multi-element readout device must be conjoined with the ridge array. Hence, the basic detector must be modified to remove one or both of the global electrodes to enable individual ridge or pillar addressing. An example of such an electrode configuration and detector interface to realize this class of spectrometer is discussed infra.

We also note that this spectrometer embodiment can be used with an optical readout modality (instead of a charge-carrier readout as discussed heretofore); an optical embodiment with this capability is discussed in section 5. We next discuss embodiments to realize nuclear conversion media in the form of nano-powders, which is common to all sensor embodiments discussed in this patent.

We now discuss several different fabrication techniques to prepare nano-powders that form the neutron conversion material for all the sensor embodiments discussed herein. As an example of a specific conversion material, we discuss powders comprised of $^{10}$B. The skilled artesian will appreciate that a variety of different compounds, beyond $^{10}$B, can be used as starting materials to form the required nano-powders. Moreover, mixtures comprised of different nuclear conversion materials (binary, ternary, etc.) easily follow from these embodiments, which may be required, depending on the sensor specifications for a given application.

For each nano-powder preparation and loading technique, it is assumed that the necessary charge-collecting structure has been previously fabricated, within which the powder is to be dispersed. In the fabrication flow charts that follow, the basic structure is labeled as "Fabricate charge-collecting structure." Thus, for each approach, the neutron conversion material is infiltrated into the given charge-collecting platform, be it in the form of a pillar array, ridged structure or more general configuration. Exemplary charge sensitive platforms and their fabrication techniques are described in U.S. patent application Ser. No. 13/014,879 and U.S. patent application Ser. No. 13/456,182, the disclosures of which are incorporated herein by reference.

Figure 5:
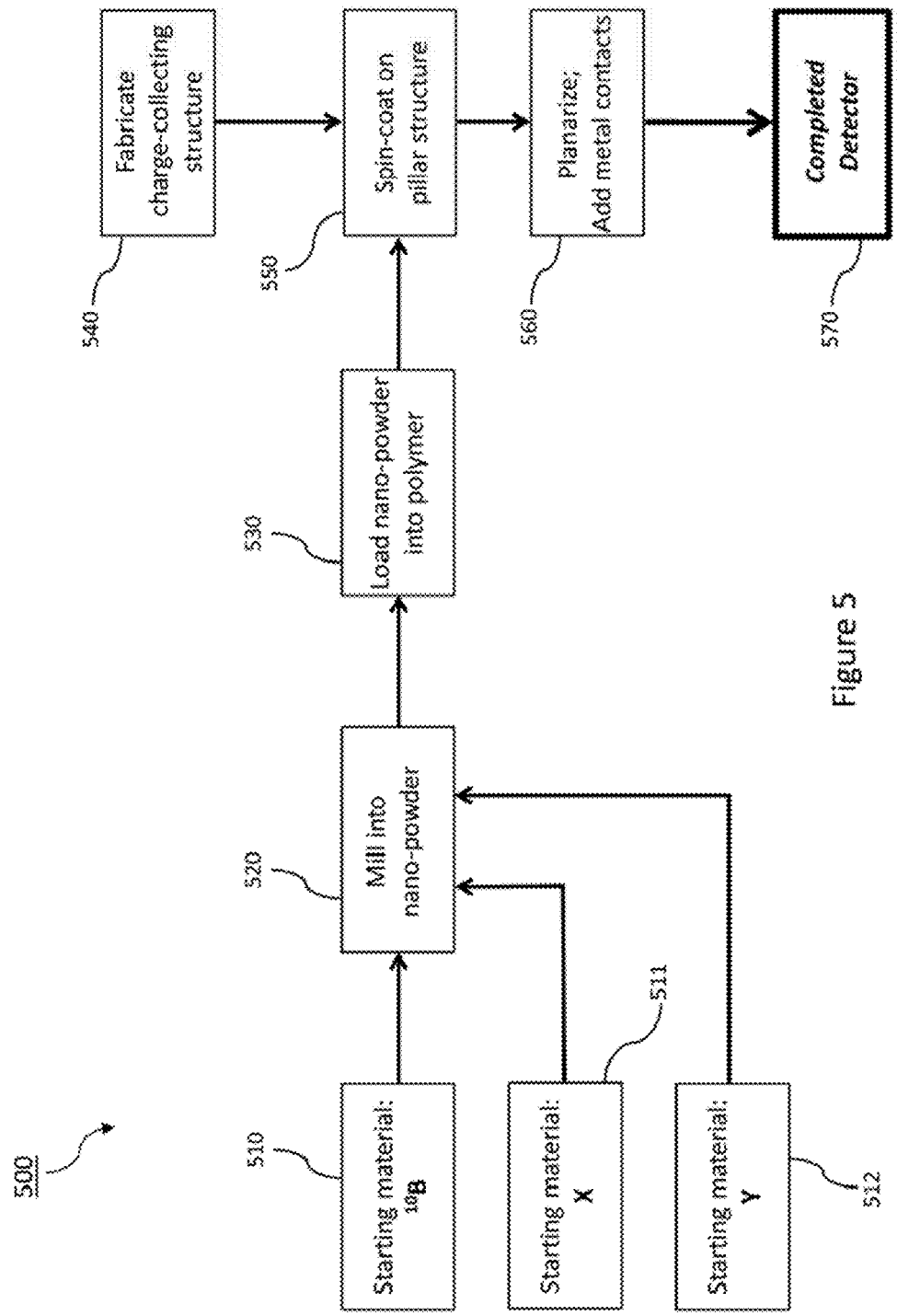
FIG. 5 depicts one method to prepare and to load neutron-conversion materials in the form of nano-powders into a given semiconductor detector structure (e.g., as in FIG. 3B) using a spin-coating process.

Turning now to FIG. 5, a spin-cast mixed-solution, nano-powder process, 500 is shown (the terms "spin-cast" and "spin-coat" are assumed herein as the same operation). In this method, the starting material 510 is generally of a particle size that is too large to be infiltrated into the conversion material platform. Assuming a relatively large particle size, the starting material is milled down into a smaller size, 520. Note that, in general, the starting material can consist of several additional species, depicted as materials "X" and "Y," by 511 and 512, respectively. The milling process can be applied to the combined starting material or individually to each starting material component. The as-milled material is then mixed with a wet chemical solvent or polymer solution, 530. This composite solution can then be spin-casted, 550, into the charge-collecting pillared structure, 540, the cavity-level structure of which has been previously fabricated, as discussed above. The mixture can also be treated with a curable polymer (as necessary) to maintain the nano-powder in place within the structure when using a wet chemical solvent. After the neutron sensitive material is interspersed into the pillar cavities, a planarization method is employed to assure a conformal, continuous upper surface of the overall structure, after which electrical contacts can be deposited onto both the n+ and p+ regions, as indicated in 560, thereby resulting in the completed thermal neutron detector, 570. Key features of this method include its relatively low-cost and simplicity, and, furthermore, that the fabrication process is compatible with "batch processing" modalities. (We note that planarization techniques have been previously disclosed in related applications by the same inventors.)

Figure 6:
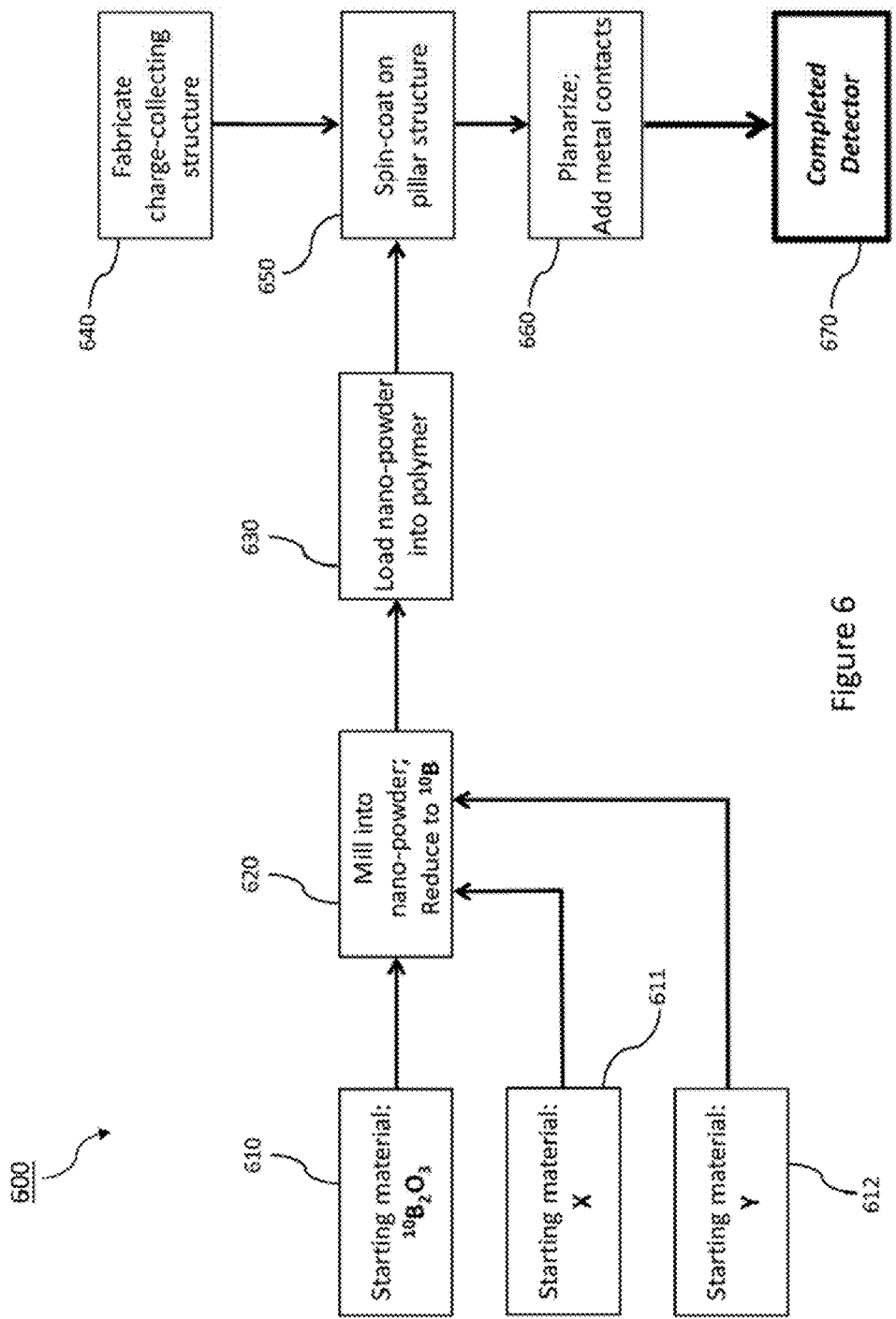
FIG. 6 depicts another method to prepare and to load neutron-conversion materials in the form of nano-powders into a given semiconductor detector structure (e.g., as in FIG. 3B) using a spin-coating process.

Turning now to FIG. 6, a spin-cast mixed-solution, nano-powder process, 600 is shown, which is similar to that shown above in FIG. 5. A key difference in this case is that the starting material(s), 610, 611 and/or 612 are not in an elemental form, but, instead, are in the form of a molecular compounds, with one (or more) constituent elements being the desired neutron conversion species. As an example, the starting compound, 610, is assumed to be a specific isotope of boron oxide, $^{10}B_2O_3$. In this case, the starting material is milled to a size-appropriate nano-powder 630, as before. In addition, the as-milled nano-powder is chemically reduced to its elemental form ($^{10}B$ in this example), via the use of such agents as Mg, Al, $H_2$, or another reducer, as is well-known in the art. A skilled artesian will appreciate that the steps of milling and chemical reduction can be performed in reverse sequence, depending on the specific compounds and reduction agents employed.

Upon successful reduction of the nano-powder to its elemental form, the subsequent processing steps of loading the nano-powder into a polymer, spin-coating it onto the charge-collecting structure, planarization of the composite structure and application of metalized contacts, as noted by the operational steps 630, 640, 650, and 660, respectively, follow the same set of processing steps, analogous to the respective steps in FIG. 5. These processing functions will result in the fabrication of a rugged and reliable neutron detector, 670.

Figure 7:
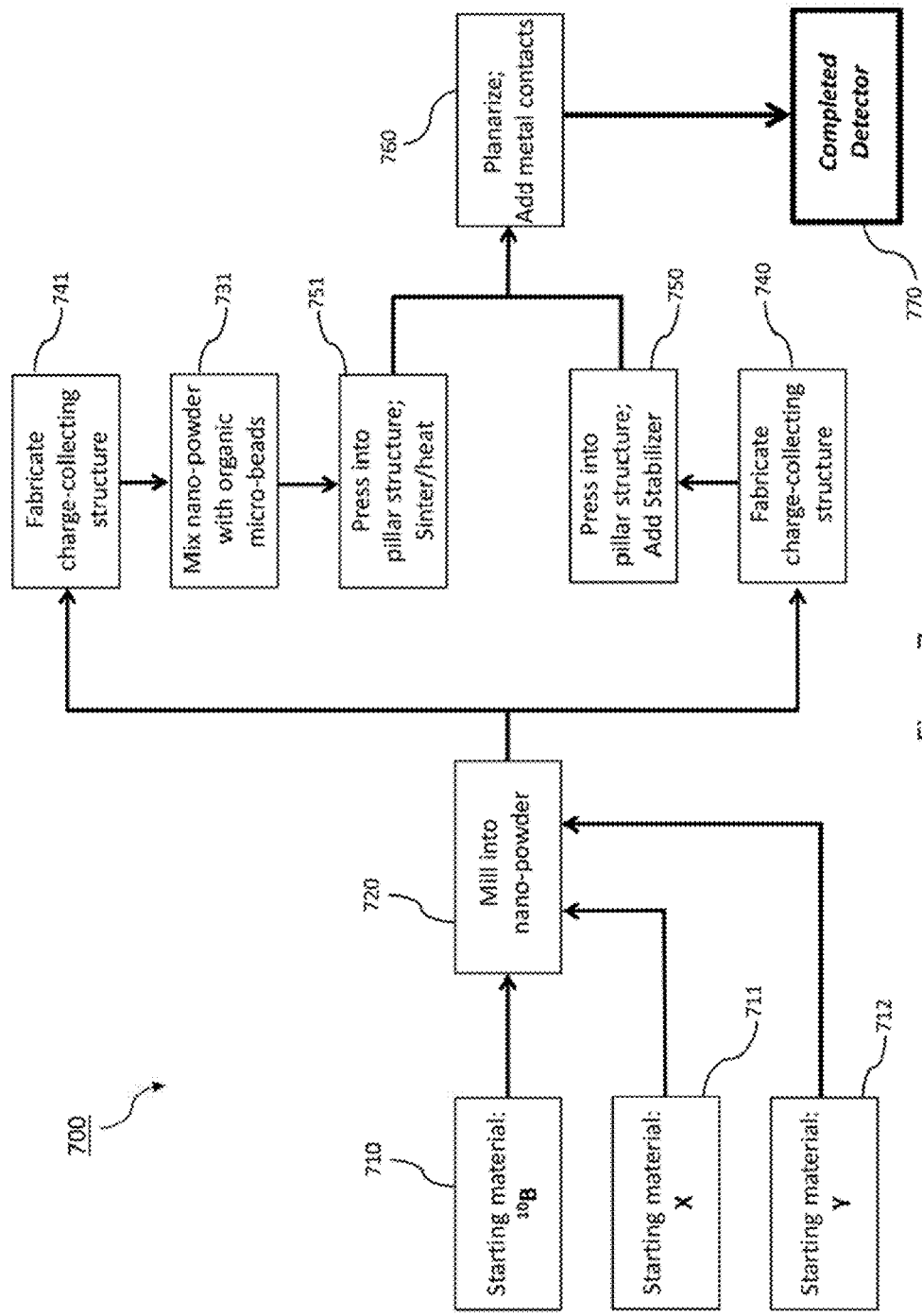
FIG. 7 depicts yet another method to prepare and to load neutron-conversion materials in the form of nano-powders into a given semiconductor detector structure (e.g., as in FIG. 3B) using a pressure-based, press-loading filling process.

Turning now to FIG. 7, two different powder insertion processes, each using "press loading," are shown, 700. In this pair of independent methods, the steps of material selection (710, 711 and 712), and powder milling (720), are analogous to the respective steps (510, 511, 512 and 520), as described in FIG. 5. The subsequent steps of press-loading the powder into the pillar structure can proceed in two different ways, as shown by the two paths in the flow chart, each of which begins from step 720, and proceeds to steps 740, 750, 760 and 770 in the first approach; or, to steps 741, 731, 751, 760 and 770 in the second approach. The specific choice of approach will be a function of the materials employed, the scale size of the sensor and its environmental and operational parameters.

In the first approach, the nano-powder is press-loaded (step 750) into the charge-collecting pillared structure, 740. The nano-powder within the pillared structure is then stabilized by dispersing an appropriate material into the now-filled cavity regions. The choice of stabilization agent is a function of the specific nano-powder and the substrate material, the choice of which is well-known to those well-skilled in the art. The subsequent steps of planarization, fabrication of the requisite n+ and p+ regions, and metalized electrode deposition, 760, proceed as outlined above, resulting in the completed neutron sensor 770.

In the second approach, the neutron-converter nano-powder, 720, is first combined with thermoplastic nano-particles, 731, prior to integration with the charge-collecting structure, 741. The compound nano-particle mixture, 731, is then press-loaded into the said structure (step 751). The now-filled structure is subsequently heated to reflow the thermoplastic-based mixture, thereby sintering the compound in situ, and stabilizing the film in place. Alternatively, the mixture can be heated during the pressing step. In a similar manner to the first approach, the subsequent steps of planarization, fabrication of the requisite n+ and p+ regions, and metalized electrode deposition, 760, proceed as outlined above, resulting in the completed neutron sensor 770.

In addition to the above approaches, there are chemical synthesis techniques as well as particle/solution decomposition methods to prepare the neutron-converter nano-powders for integration into the charge-collecting structure.

In the case of chemical synthesis, a starting material (e.g., $^{10}B$) is chemically digested and precipitated, resulting in a nano-powder of boron oxide, $^{10}B_2O_3$. This synthesis process essentially provides the starting material for step 610. The remaining steps, as outlined with respect to FIG. 6, are subsequently performed, resulting in the desired thermal neutron sensor.

In the case of solution phase decomposition, a solution is prepared, comprised of methanol (or, other suitable liquid) and a soluble neutron-converter oxide, such as $^{10}B_2O_3$. A charge-collecting pillared structure is then submerged into the solution. The structure, now with wetted solution, is allowed to air dry. This results in a methanol-based deposition of the desired neutron conversion material onto the exposed pillar surfaces. It was found that the $^{10}B_2O_3$ penetrates somewhat into the pillars and is most likely comprised of a mixture of $B_2O_3$ and $B(OH)_3$. Complete filling within the array of pillar cavities is accomplished by placing the coated structure into an oven and baked at 500° C. This temperature is sufficiently high to cause the $B(OH)_3$ to decompose and melt the subsequent $B_2O_3$, thereby filling the intra-pillar cavities. This loading technique may be amenable to the fabrication of a passive, neutron-image-to-optical-image converter, in the form of a micro-channel plate structure, as discussed in section 5.1 below.

In addition to the three basic device fabrication methods discussed above, various augmentation techniques can be used to enhance the fabrication processes and to also improve the yield, reliability and quality assurance of the neutron detectors. Furthermore, these augmentation techniques can also minimize voids within the powder volume as well as minimize delamination of the solidified powder at the powder-wall interface within the pillared semiconductor matrix. One or more of the following augmentations can be combined to advantage.

As a general augmentation approach, the filling process can take place in a vacuum chamber to minimize air voids that would otherwise result in delamination, etc. Additionally, by applying ultrasound to the workpiece during the powder filling process, a more homogeneous and uniform density of the powder mixture can result. The ultrasound can be applied to the structure via direct contact by a suitable transducer or can be applied to a container comprised of the fill-powder, or solution thereof, the latter in which the basic detector structure is immersed.

As yet another enhancement method, thermal energy (beyond a convection oven) can be selectively applied locally during the sintering fabrication step to produce a more uniform solidified powder volume. One such example involves one or more laser beams directed at the semiconductor matrix. Assuming that the semiconductor is transparent at the selected laser wavelength (viz., the laser photon energy is less than the semiconductor bandgap), and further assuming that the powder is highly absorbing at the chosen wavelength, the laser energy could be deposited directly to the pillar/powder surface interface. An example could be the use of a mid-IR or far-IR source (e.g., a 10.6 μm $CO_2$ laser), whose wavelength lies within the bandgap of a matrix comprised of Si or GaAs. Since Si is transparent to the 10.6 μm beam, the light would be absorbed by the nano-powder, precisely at the boundary interface of interest.

As yet another fabrication enhancement example, the powder-filled detector can be placed in a microwave cavity. Assuming that the starting powder has a large microwave absorption cross-section, the powder can be uniformly heated throughout its volume, resulting in a more homogeneous sintered powder with minimal voids and/or wall delamination. If the pure powder does not absorb sufficient microwave energy for this processing step, a highly absorbing secondary nano-powder can be admixed with the neutron-converter nano-powder, the latter to provide the desired local microwave-induced heating. An example of a microwave-absorbing material could be carbon nanotubes or carbon nano-particles. The density of the nanoparticles is chosen to be very small relative to the neutron-interacting component (e.g., $^{10}B$), yet of sufficient density and absorption to enable the microwave heating to take place primarily within the nano-powder powder volume.

It is to be appreciated that, since concurrent processing constraints do not pose fabrication limitations insofar as the present embodiments are concerned, materials that would otherwise have been precluded in the prior art, can now be considered. Therefore, the fact that the charge-collecting structure as well as the nano-powder preparation can be processed and fabricated independently, novel sensor materials can now be considered. In addition, other classes of semiconductors can be employed, such as Si, Ge and alloys (GaAs, InP, etc.), as well as other neutron-sensitive materials.

Furthermore, novel charge-collecting structures can be employed to enhance the sensitivity and noise performance of the detector. Examples include quantum-well-structures (e.g., quantum-dot structures) and other heterostructures, which can minimize deleterious surface recombination effects at the various interfaces and walls, and, therefore, enhance carrier mobility and lifetimes, and solid-state avalanche equivalents for in situ low-noise amplification, etc.

In the prior art, the basic neutron detector is taught as a single-pixel sensor, or, equivalently, as a non-imaging single-aperture detector. As depicted in FIG. 2, the prior art teaches a pair of sensor electrodes that are conformal with, and globally contacting, the entire respective upper and lower surfaces. Hence, the array of p-i-n diodes are effectively all electronically connected at each respective end, or, equivalently, connected in parallel. Therefore, the prior art detector is not capable of indicating which pillar(s), or p-i-n diode(s) have individually interacted in response to a neutron event. Hence, the prior art does not enable multi-pixel imaging of the array.

We now teach an embodiment of a multi-pillar sensor that can function in a two-dimensional imaging detection mode. When interfaced with a ccd (or equivalent) detector, a compact imaging neutron detector, with an electronic, video output capability, can be realized. The video signal can therefore reveal the presence of one or more charge-collecting events that occur at given pillars or at given ridges in the array. The ccd readout can be in the form of a linear detector array (thereby providing multi-pixel information along a single dimension) or in the form of a two-dimensional detector array (thereby providing a full two-dimensional video imagery of a neutron beam).

We note that multi-pixelated neutron detector arrays, as taught in this patent, can be realized using various readout modalities. Examples of embodiments herein include electronic readout via charge-carrier structures (recall, section 2), as well as optical readout via scintillometer structures (to be discussed in section 5 below). In the present case, we limit our discussion to the former approach, namely, a charge-carrier-based sensor.

Figure 8:
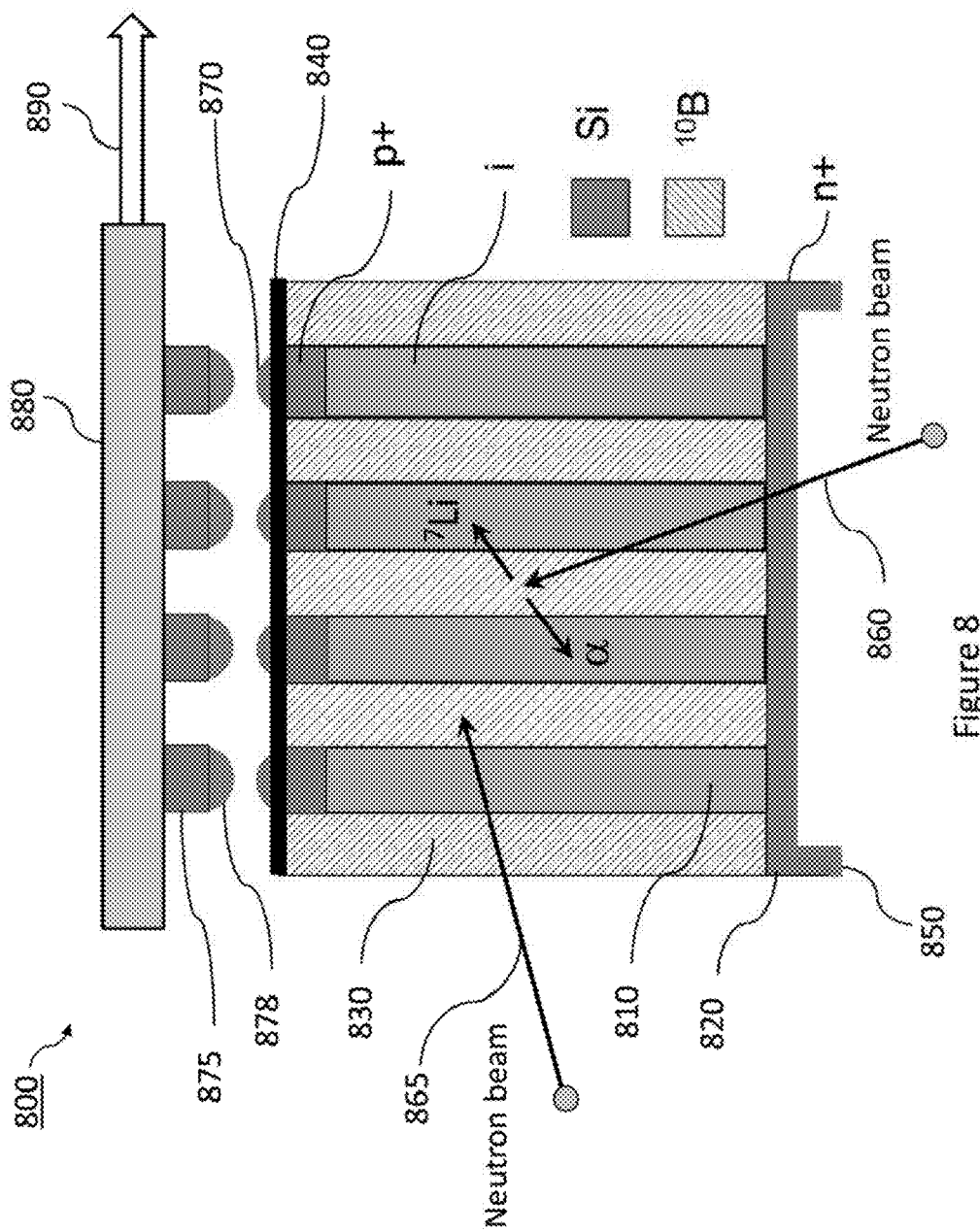
FIG. 8 shows details of a solid-state 2-D neutron detector with pixelization capability for imaging and/or spectroscopic applications.

The salient features of a pixelated neutron detector 800 embodiment are shown in FIG. 8. As reference, recall that the basic, multi-pillar neutron detector, configured as a single-aperture detector, including its operating principles, material composition and parameters, fabrication and planarization techniques—and basic performance attributes, are fully described above, as well as in the pair of above-referenced U.S. patent applications by the same inventors.

Turning to FIG. 8, the basic detector is comprised of a two-dimensional grid of Si pillars 810, of high aspect ratio, formed onto a common semiconductor (e.g., Si) substrate 820. Intervening layers of a suitable neutron interaction material 830 such as $^{10}B$, with a high cross section for the production of ionizing product channels, are formed between the Si pillars in the array using the powder fabrication and interspersing techniques discussed theretofore.

Recall, in the prior art, the Si pillars are fabricated as a parallel array of p-i-n diodes, with the upper and lower respective surfaces of the pillars electronically connected by suitable upper and lower conductive surfaces; 840 and 850, respectively. During operation, a beam of neutrons is typically incident upon the detector from above (recall FIG. 3C, 360). Upon interaction of a neutron with the $^{10}B$ vertical layers, products such as $^7Li$ and α-particles are produced. These decay products subsequently interact via ionization in the Si pillars, giving rise to charge carriers, which result in a detectable photocurrent across the entire vertical structure. Since the upper and lower surfaces of the detector are each, respectively, electrically shorted via a global pair of electrodes in the prior art, the entire structure acts as a single, large-area detector, with an array of coupled p-i-n diodes electrically combined in parallel. Hence, the prior art is incapable of providing spatial (image) information regarding the lateral location of the impinging neutron beam.

Turning now to FIG. 8, a multi-pixel neutron sensor, 800, with a two-dimensional neutron imaging capability, is shown. This embodiment utilizes the basic detector of the prior art, but, in place of one of the global electrodes a multi-pixel charge detection array is utilized. Hence, only one surface of the sensor is comprised of a global electrode 850 and a global, highly doped (e.g., $n^+$) region 820. That is, only a single end of the p-i-n diode array (e.g., the lower pillar surfaces) is electronically shorted. The other surface of the sensor, 840, is comprised of a two-dimensional array of exposed upper pillar surfaces (without a global electrode), thereby enabling electrical contact to each respective p-i-n diode independently.

In the detector imaging modality, the incident neutron beam impinges upon the sensor at the substrate side of the device, 820 and 850, as opposed to the opposite side (as in the prior art). Hence, the incident beam of neutrons 860 now impinges through what was the former "lower surface" of the detector (the so-called handle, comprised of layers 820 and 850), as opposed to what was the prior-art "upper surface." This new orientation provides a multi-pixel readout capability across the exposed surface 840 of the detector.

In this imaging embodiment, the global planar surface electrode 840 is not present. Instead, electrical contacts are fabricated onto each individual Si pillar (or, a small cluster of pillars) by an array of corresponding solder bumps 870, as an example. Using well-known contacting techniques, such as flip-chip technologies, a multi-element, monolithic array of amplifiers 880, with underside contacts 875 and corresponding solder bumps 870 can be aligned with array of respective Si pillars via its respective solder bump or ball array 870, etc.

Therefore, as opposed to depositing a single, global, electrode across the entire surface, individual Si pillars can be henceforth addressed via an ensemble of independent electrodes. This configuration enables video image detection, given that the photocurrent at each pillar, forms an equivalent pixel of the composite array. Hence, the Si pillars can be individually connected to an appropriate two-dimensional, multi-element sensor, 880, such as a ccd detector array, a solid-state avalanche detector array, etc. Therefore, as neutrons interact in a given region of the detector, the presence of a photocurrent at a given physical Si pillar provides spatial resolution of the event interaction. As shown in the figure, each Si pillar is treated individually.

The video output 890 of the ccd array therefore provides spatial information regarding the physical pillar (or, pixel) where the neutron impinged. Various post-processing techniques (which can be programmable and, further, can be on-chip) could be implemented, including multi-pixel centroid algorithms, temporal integration and gating, analog or digital processing, de-blurring, etc. for enhanced imaging capabilities.

In certain scenarios, the required spatial resolution may be larger than the pitch of the pillars. In such cases, localized clusters, or, subsets, of Si pillars can be summed, either physically (via a set of electrode "patches") or electronically (via programmable summation of selected ccd elements).

The multi-pixel imaging capability of the neutron sensor can also be utilized in the case of multi-ridge pillars, whereby the incident neutron beam, 865, is incident from the "side" of the sensor. This basic beam alignment, and, potential spectroscopic applications thereof, is discussed above with respect to FIG. 3C (365) and FIG. 4B (465).

Up to this point, we have presented embodiments that combine a neutron-converting powder with a charge-collecting structure to realize a compact, ruggedized thermal neutron detector. Given that the neutron-converting powder emits ionizing particles in response to a neutron event, other physical mechanisms can be utilized to sense the presence of these particles. Beyond the generation of charge carriers within semiconductor-based structures, optical-based interactions can be employed as a result of the neutron-induced interaction products. One class of embodiments, as described herein, utilizes scintillometer materials. When a particle of sufficient energy interacts in a scintillometer, ionization processes can result in the generation of optical photons, as is well-known in the art. In this manner, a thermal neutron sensor can be realized that generates photons (instead of charge carriers), which can be subsequently detected using a variety of optical detection techniques. Therefore, a neutron-conversion nano-powder-filled structure, in conjunction with a suitable scintillation material can be fabricated, with optical detection capability, effectively replacing charge-carrier detection.

A key benefit to utilizing optical sensing techniques, as opposed to charge-carrier based techniques, is that photon sensors are, in general, faster responding than micro-electronics counterparts. Also, the latter devices can be limited by carrier transport, as well as capacitive and inductive effects. Owing to charge-transport limitations, optical systems typically respond faster and, concomitantly, with relatively less measurement dead-times. Moreover, the optical-based sensors discussed herein are expected to be less susceptible to radiation damage, are passive (no prime power required), nonmetallic (no conductive contacts required), less costly (glass, nano-powder, tubular structures) and lower weight.

Turning now to FIG. 9, a multi-pixel detector embodiment 900 is shown that has the property of converting an incident neutron beam with spatial information to an optical image with a one-to-one coherent mapping capability. The basic module can be viewed as a micro-channel plate (MCP), comprised of interspersed arrays of nano-powder columns with arrays of fiber-optic scintillometers. In essence, the periodic structure is a multi-pixel analog to a single pillar of nano-powder, placed adjacent to a single optical fiber scintillometer. When the optical output of this powder-loaded, fiber arrayed scintillometer MCP is combined with an image intensifier, an equivalent neutron-to-optical image intensifier is realized. The overall device can be of any general shape, including rectangular, square, circular, etc.

A neutron beam can be incident upon the device in two different orientations (recall FIG. 3C). In one configuration, a neutron beam 960 is incident upon the device in a direction parallel to the axes of the micro-channel plate cylindrical features, thereby illuminating the MCP interaction regions simultaneously. This beam alignment is analogous to the orientation of an image-bearing beam with a conventional image intensifier. In another configuration, the neutron beam 965 is incident upon the MCP from the side of the structure, so that the beam propagates through the structure, encountering each interaction region sequentially. This is analogous to the neutron spectrometer orientation, discussed in reference to FIG. 4C, but, now, with an optical material (i.e., a scintillometer structure) replacing the charge-collecting material (e.g., a semiconductor).

As shown in FIG. 9, the basic structure 910 is comprised of an array of cavities 930, similar to that of FIG. 3A, which was utilized in the case of charge-carrier sensing. In this optical detection embodiment, scintillometer material 915 is employed instead of the semiconductor material of FIG. 3A and FIG. 3B (recall, 315). The cavity regions in the present case are filled with an appropriate neutron nano-powder converter material, 930, using one of more powder preparation and fabrication methods discussed heretofore. This results in a periodic array comprised of alternating scintillometer pillars (or ridges), 915, interspersed with layers of nano-powder media 930.

In this embodiment, a thin cladding layer 918 (with an optical refractive index, $n_2$) is deposited onto the vertical walls of the scintillometer pillars 915 (the latter, with an optical refractive index, $n_1$, where, $n_1 > n_2$). This pillar structure functions as an optical waveguide, providing optical-mode confinement within the scintillometer "core" of the guide, while, concomitantly, minimizing optical waveguide losses that would otherwise have occurred at the scintillometer/nano-powder interface in the absence of a cladding layer. Optical waveguide design rules are well-known to those skilled in the art.

When a neutron event occurs, the neutral particle interacts with 10B (as an example) in the nano-powder, giving rise to an α-particle and an atom of $^7$Li. One or both of these resultant particles will interact within the scintillometer pillar (via an ionization process), resulting in the emission of photons. Many of these photons will be guided by the scintillometer-based waveguide, emerge at both ends (in general) and, ultimately detected by the pixelated (985) photodetector 980, generating an output video signal 990.

We note that, in the optical detection mode, electrodes are not required (recall FIG. 3C: electrodes 310 and 340), nor are the highly doped n+ and p+ regions (recall 307 and 308 in FIG. 3C), typical of charge-carrier based detectors. The result is that the basic optical sensor is not as complex to fabricate, and, further, does not require metallic structures or components. This enables the sensor to be employed under conditions that may otherwise be detrimental in the case of microelectronic-based devices (e.g., high-radiation environments).

As shown in FIG. 9, and discussed above, the incident neutron beam can impinge onto the sensor in a normal-orientated configuration, whereby the beam propagates perpendicular to the plane of the substrate, or, in a configuration whereby the neutron beam impinges onto the sensor from the side; in a direction parallel to the plane of the substrate. Examples of applications (e.g., spectroscopic-based applications), using these various beam-orientation configurations, in conjunction with pillar and ridge designs, are analogous to the charge-carrier sensing embodiments described in section 2 above.

In certain scenarios, competing interactions that involve incident beams other than neutrons (e.g., charged particles, gamma rays, etc.) can result in false-alarm rates. Such deleterious effects can be minimized using a variety of active and passive techniques. An example of an active technique includes the presence of other classes of detectors that are optimized to detect the competing events. These detectors can provide anti-trigger signals to effectively gate out undesirable events. An example of a passive approach is the placement of state-selective absorbers in the path of the incident beam, whose transmission is relatively high for neutrons, and, concomitantly, highly absorbing for other particles. These passive filters can be attached to the optical-based sensor 910 to function in either the normal-incidence configuration—in which case, a filter 970 is placed in the path of the incident beam 960—or in the side-oriented beam configuration, in which case, a filter 975 is placed in the path of the incident beam 965.

The optical detector 980 can be a single-pixel or a multi-pixel device. In the case of a single-pixel detector, all the photons that emerge from the scintillator channels are combined onto a single photodetector. Hence, the detector performs the function of integrating the optical signal across all channels. This embodiment is analogous to the charge-carrier sensor depicted in FIG. 3C, in which case, a pair of global-electrodes sums the photocurrents across all p-i-n pillars.

In the embodiment depicted in FIG. 9, the detector 980 is a multi-pixel device, such as an image intensifier, a ccd array, a solid-state avalanche diode array, a photomultiplier tube, etc. In this configuration, an optical image is formed, whose pattern is a one-to-one mapping of an incident, image-bearing neutron beam. Hence, spatial neutron beam information can be obtained.

In essence, the pixelated optical neutron converter element of FIG. 9, can be viewed as a micro-channel plate of interspersed neutron nano-powders and optical scintillometer waveguides. When combined with an image intensifier, an equivalent neutron-to-optical image intensifier is realized.

Using one of the nano-powder fabrication methods (viz., the liquid immersion method), could result in a rapid and low-cost approach to fabricating such a micro-channel plate. As an example, a micro-channel plate comprised of scintillometer waveguide channels, alternating with hollow channels, can be immersed into a liquid comprised of the desired nano-powder in solution. Capillary action will enable the desired neutron nano-powder solution to fill the hollow channels, resulting in a simple, compact, pixelated neutron-to-optical imaging transducer.

We now describe an embodiment that involves a long-length, distributed fiber-optic neutron detector, with position determination capability. The sensor provides an optical signal in response to the interaction of a neutron event along its length, with the further capability to determine the specific location of the event along the length of the fiber. The basic system, as shown in FIG. 10A and FIG. 10B, can be viewed as a distributed optical-fiber-based detector that converts neutron events along its length to optical signals via a scintillation process. The resultant scintillometer photons propagate along the optical fibers to detectors at one or both ends of the structure, thereby providing photodetection of the neutron-mediated interactions. In addition, the system provides position location capability of a given event along the fiber length by measuring the photon time-of-flight along the fiber via a self-referencing transit-time-to-range technique. The distributed fiber-based sensor is lightweight, rugged, flexible and enjoys a graceful degradation lifetime characteristic.

Turning now to FIG. 10A and FIG. 10B, a typical embodiment 1000 of this sensor is shown. FIG. 10B is a cross-sectional view, corresponding to an A-A sectioned cut of the fiber structure in FIG. 10A. The neutrons 1065 to be detected are typically incident in a direction normal to the long axis of the structure. This beam alignment is similar to that depicted in FIG. 3C and FIG. 4C, where a neutron beam (365 and 465, respectively) impinges upon the sensor from the side of the structure. The overall structure 1000 can be of lengths ranging from mm's to km's, and, can be of diameters in the range of mm's to cm's.

The basic structure is comprised of two classes of flexible, fiber-based components: (1) a central hollow fiber, loaded with neutron conversion nano-powder material 1030; and (2) an ensemble of optical fibers, each comprised of scintillation materials 1015, that are parallel to, and, surround the powder-loaded central fiber. An optical detector 1080, whose function is to detect scintillation-emitted photons, is located at one end 1005 of the fiber-based structure. At the opposing end of the fiber structure 1007, either a second detector is located (not shown) or, a distributed waveguide Bragg grating reflector 1077 is fabricated into each fiber 1015. (The optical detector 1080 is typically comprised of a single pixel. However, depending on the scale size of the sensor and signal-to-noise considerations, an optional [annular] array of pixels 1085 can be employed.)

The photons generated within the optical fiber ensemble 1015 result from an initial neutron converter interaction in the central nano-powder loaded fiber 1030, followed by a scintillation event, the latter as a result of neutron/10B products (7Li; α) that induce photons via ionization processes in the scintillator fiber(s). More details that pertain to this set of basic interactions are discussed in reference to FIG. 9 above.

As shown in FIG. 10A and FIG. 10B, a long length of hollow tubing 1030, of length, L, which can be flexible, is used to contain a neutron conversion nano-powder, such as $^{10}B$. Various nano-powder loading methods, such as those described above in section 3 herein, can be used to prepare and load the nano-material into the small-diameter tube. The diameter of the powder-filled tube is in the range of a neutron conversion interaction length, which is typically on the order of 100 μm.

Surrounding the $^{10}B$ powder-loaded hollow tube is a fiber bundle, 1050, which is comprised of one of more optically transparent scintillation materials. In the embodiment of FIG. 10A and FIG. 10B, the optical fiber portion of the overall detector is configured as a set of parallel optical fibers, each of length, L. Hence, the powder-filled tube is surrounded by an ensemble of (scintillometer) sensitized fibers, arranged as an annular ring of fibers that can be attached around the circumference of the neutron-converter tube outer-diameter, as depicted in FIG. 10B. Alternatively, the scintillometer fibers can be positioned, within the powder-filled tube, coincident with, and parallel to, the axis of the structure. In this case, the powder effectively surrounds the scintillation fiber(s), instead of the other way around.

Upon interaction of the neutron beam with the neutron-sensing media, particles are produced, such as $^{7}Li$ and an alpha particles, α. Most of these interact with the said scintillation sheath via well-known interactions, including ionization and emission of photons. The scintillation material also functions as an annular optical waveguide whose optical guided-mode propagates within the sheath, with most of the photons emerging from the surface of either end of the sheath. A photomultiplier (PM) detector, or other photodetector, such as an avalanche detector, solid-state PM detector, etc then converts the detected light to an electronic signal for detection and processing.

As noted above, the hollow-core diameter is chosen to be approximately equal to, or greater than, the neutron interaction length, thereby assuring efficient production of the desired neutron interaction particles, $^{7}Li$ and an alpha particle, α. In addition, the annular width of the scintillation sheath is chosen to be approximately equal to the scintillation interaction length that produces photons via interaction of the byproducts of the neutron interaction (that emerge radially outward from the core region into the sheath). By specifying the hollow-core structure and core region subject to these design rules, the generation and detection of at least one photon for each neutron incident onto the overall detector can be obtained.

The fiber-based system can be used as an extended (i.e., a distributed) neutron detector of arbitrary length, limited by photon losses in the fiber. A long fiber can be configured to not only provide information of a given neutron event over a long sampling distance, but, additionally, provide information as to the physical location along the fiber at which the event occurred. This can be accomplished by measuring the differential photon time-of-flight at both ends of the sensor. This can be viewed as a self-referencing range measurement, since the difference in the arrival time between the first and second photons (from the same neutron event) provide the necessary information. Hence, an absolute synchronization signal is not required.

A variant on this technique to yield the desired location information can be realized using a single detector 1080 placed at one end 1005 of the fiber structure and a reflective element at the opposing end 1007. Referring to FIG. 10A, this can be realized by embedding a reflective element 1077 (e.g., a waveguide distributed Bragg grating) at the far end of the fiber. In this manner, when a scintillation event occurs, two sets of identical, yet, time-delayed signals, will be detected, whose composite output signal 1090 is given as $S(t)=f(t)+f(t-\tau)$.

The first-arrival, f(t), corresponds to the light that propagates from the given scintillation event directly to the photon detector at one end of the fiber. The second-arrival, $g(t)=f(t-\tau)$, corresponds to the light (from the same scintillation event) that first propagates to the opposite end of the fiber. This light then reflects from the end of the fiber via reflective element 1077, and then propagates back along the entire length, L, of the fiber, ultimately, reaching the same photon detector 1080 as the first-arrival pulse. The difference in the time-of-flight, τ, of this pair of pulse replicas is equal to twice the time delay, or, physical distance, from the scintillation event to the opposing end of the fiber, $L_1$ (i.e., the fiber end comprised of the reflective element 1077).

A more precise determination of the given event and its physical location can be ascertained by recording the complex incoming pulse, f(t), and its delayed replica, $g(t)=f(t-\tau)$ over a given temporal window, and, then performing a temporal cross-correlation of the pair of waveforms. The result of this operation will reveal the time-delay, τ, that optimizes the cross-correlation integral. The longer the pulse train, the more precise the determination of the time delay, and, hence, the greater the accuracy of the physical location of the neutron event. As an example, if a Geiger modality is employed, a sequence of randomly distributed photon pulses could be detected over a given time period. The temporal cross-correlation calculation will reveal the event location, $L_1=c\tau/2n_{eff}$ (where $N_{eff}$ is the effective refractive index of the guided mode), with an uncertainty on the order of the reciprocal of the overall waveform time period, for a given signal-to-noise factor.

In general, the precise location of the neutron interaction with the nano-powder will not necessarily be the same as the physical location of the subsequent scintillation event in the fiber. We note, however, the difference of physical location (along the length of the fiber sensor) of the actual neutron event and that of the subsequent scintillation will be much less than the accuracy with which the event can be localized in the time domain. This follows, since the mean-free paths that govern the neutron and subsequent scintillation interactions are in the range of 10's of microns, as opposed to the optical transit-time determination, which is on the order of mm to cm. Hence, the physical location of the scintillation event is, for all intents and purposes, a good indicator of the actual neutron event.

One can increase the accuracy with which the temporal correlation function is determined by modifying the optical fiber configuration with respect to the overall structure. Recall above, that a set of long fibers are placed along the length of the fiber, as shown in FIG. 10B. Therefore, the total fiber length is equal to the length of the powder-filled tube. However, in another embodiment, a single fiber (or a small set of fibers), can be wound around the powder-filled tube and along its length in a helical pattern, as in a spool. In this case, the total fiber length increases roughly by the number of fibers in the former embodiment. Therefore, the ability to determine the physical location of an event is enhanced, given that the temporal photon delay along the length of the tube is now dictated by the pitch of the helical pattern and the outside diameter of the fiber(s); and, not by the physical length of the tube. As an example, assuming a 1 mm (1000 μm) diameter powder-filled tube, and a 10 μm scintillation optical fiber, the increase in the total fiber length will be a factor of ≈10 times greater in the case of a spooled configuration. For a given photon timing resolution (say, 100 psec), the second embodiment implies that the effective resolution is now ≈10 psec, which is equivalent to a location accuracy of 3 mm instead of 3 cm. Hence, one can now determine the physical location along the fiber to within 3 mm. At this level of precision, for a 2-D neutron mapping application, instead of using two sets of crossed fiber "screens," one can employ a single screen of fibers for the x-coordinate locator and the photon timing algorithm for the y-coordinate locator.

To this point, we have considered a single neutron detection element using an optical fiber approach. The photon detector(s) can be configured to either function as a single, integrated photon sensor or as an array of photon detectors, the latter case enabling the determination of the spatial coordinates of the neutron interaction sites. In the case of multiple optical detectors, either single photodetectors can be placed, individually, at the end of each respective hollow-core powder-filled tube or, a pixelated, imaging sensor can be used (e.g., an image intensifier, video detector, etc.). In the former case, the system will provide a set of discrete electronic signals for processing (e.g., one channel per tube), whereas, in the latter case the array detector will provide an optical image of the composite neutron interaction sites for subsequent image processing.

Using an ensemble of long, distributed neutron fiber sensors, embodiments can be realized that enable two-dimensional neutron imagers with optical readout capability. Clusters of such fiber-based neutron sensors can be arranged in a circular pattern, or in a linear pattern. In the latter case, one can arrange a set of such fibers in the form a group of parallel fibers, each with its own optical readout. Therefore, each neutron fiber sensor, as shown in FIG. 10A and FIG. 10B are independent of each other, but, taken as a whole, collectively appear as a sheet, or one-dimensional screen of parallel fibers.

As an example, assume that the fiber array is positioned in an x-y plane, with each fiber parallel to the y-axis. Hence, for a given neutron event, a single fiber (or a few neighboring fibers) will emit photons in response to the interaction and subsequent scintillation. The location of the signal will therefore indicate the x-coordinate (the horizontal location) of the event. The y-coordinate of the event can be ascertained in at least two different ways. In one case, the photon transit time through the given fiber(s) can provide the vertical location of the event, as discussed above.

A second approach to ascertain the vertical position of the event involves placing a second "screen" of fibers, also in the x-y plane, but, oriented along the x-axis. Hence, the two screens are orthogonal to each other. Therefore, the presence of a neutron event will given rise to photons in one or more fibers in each screen, thereby providing both the horizontal and vertical location of the given event, without the need for transit-time processing.

In this manner, the crossed layers, with each comprised of a linear array of neutron sensors can be stacked or cross-stacked, with the ensemble arranged so that the neutron beam strikes the array of sensors transverse to the plane. In essence, the overall structure has the appearance of a wire screen, but with neutron-sensing fibers replacing the woven, cross-hatched wires. Using this arrangement, in the case of cross-stacked layers, the spatial location of the neutron beam in the transverse plane crossed-pair of layers can be ascertained for purposes of neutron trajectory determination.

The skilled artesian will appreciate that there are system tradeoffs when comparing the optical technique for neutron sensing versus the charge-carrier approach. In the case of the optical approach, the system is expected to possess a faster responding that an electronic readout, as well as shorter dead-times, less susceptibility to radiation damage, and, also, the optical system is passive (no prime power required), nonmetallic (no conductive contacts required), less costly (glass, powder, tubes) and lower weight. The charge-carrier approach, on the other hand, is better suited to integration with microelectronic post-processing and can also be a chip-based sensor, suitable for 3-D micro-electronics integration.

The skilled artesian will also appreciate that, in the case of detectors that comprise powders as the neutron conversion media, the configuration of the basic structure, and the materials utilized thereupon, can be generalized. This follows, since the basic neutron detector is not limited to thin-film processing constraints, typical of semiconductor crystalline materials. As a simple example, pillars of arbitrary cross section (rectangular, circular, etc.) and aspect ratio can be considered. This follows, since, absent from the constraints and shadowing limitations of thin-film fabrication methods, the powders can conform and fill myriad cavity configurations.

Furthermore, the fabrication of the charge-collecting structure can employ techniques beyond those typical of semiconductor processing. As an example, one can employ state-of-the-art 3D lithographic processing, such as CAD/CAM fabrication of a structure via layer-by-layer growth techniques. Hence, one can realize arbitrarily shaped charge-collecting structures to best satisfy the requirements for a specific geometry. Thus, the sensor can be designed with the charge-collecting structure surrounding the neutron conversion material, and vice versa.

In addition, the overall shape of the entire sensor can be tailor-made to optimize the neutron detection for a given end-user application. Shapes can include cylindrically configured detectors that surround a work piece under examination with cylindrical symmetry. Other examples of specific detector designs include compact detectors that can be attached to robotic manipulators for inspection in high-radiation environments, lightweight sensor arrays, with aerodynamically designed shapes, suitable for integration into UAVs, underwater arrays of distributed neutron-to-optical passive fiber sensors, fiber sensors woven into meshed sheets, and, so on.

The embodiments disclosed were meant only to explain the principles of the invention and its practical application to thereby enable others skilled in the art to best use the invention in various embodiments and with various modifications suited to the particular use contemplated. The scope of the invention is to be defined by the following claims.

We claim:

1. An apparatus, comprising:
   a charge sensitive platform including a structure including a p+ region on a first side of an intrinsic region, an n+ region on a second side of said intrinsic region and extending portions formed of one of said p+ region or said n+ region and a portion of said: intrinsic layer, wherein said extending portions have space between each extending portion of said extending portions, wherein said extending portions have a pitch within a range from about 0.1 μm to about 10 μm and a height within a range from about 10 μm to about 200 μm; and
   particles of neutron sensitive material located: in said space, wherein all of said particles have a diameter consisting essentially of $10^{-6}$ m or less.

2. The apparatus of claim 1, wherein said particles comprise a molecular compound having one or more constituent elements including said neutron conversion species.

3. The apparatus of claim 1, wherein said particles organic micro-beads.

4. The apparatus of claim 1, wherein said particles comprise thermoplastic nanoparticles.

5. The apparatus of claim 1, wherein said space between each extending portion is less than 5 μm.

6. The apparatus of claim 1, wherein said space between each extending portion is about 2 μm.

7. The apparatus of claim 1, wherein said extending portions are selected from the group consisting of pillars and ridges.

8. The apparatus of claim 1, wherein the thickness of said intrinsic region is selected to achieve a desired neutron to gamma discrimination.

9. The apparatus of claim 1, further comprising a first electrode in contact with said extending portions; and
a second electrode in contact with the one of said first side or said second side that is on a side opposite of said intrinsic layer with respect to said first electrode.

10. The apparatus of claim 1, wherein said extending portions comprise a pitch selected from a group consisting of (i) within a range from 1 μm to about 3 μm and (ii) about 2 μm.

11. A method, comprising:
providing a charge sensitive platform including a structure including a p+ region on a first side of an intrinsic region, an n+ region on a second side of said intrinsic region and extending portions formed of one of said p+ region or said n+ region and a portion of said intrinsic layer, wherein said extending portions have space between each extending portion of said extending portions, wherein said extending portions have a pitch within a range from about 0.1 μm to about 10 μm and a height within a range from about 10 μm to about 200 μm; and
filling said space with particles of neutron sensitive material (NSM), wherein all of said particles have a diameter consisting essentially of $10^{-6}$ m or less.

12. The method of claim 11, further comprising:
providing starting particles a plurality of which comprise a diameter of greater than $10^{-6}$ m; and
processing said starting particles to produce said particles of NSM.

13. The method of claim 12, wherein the step of processing comprises milling said starting particles to produce said particles of NSM.

14. The method of claim 12, wherein said starting particles comprises boron oxide, wherein the step of processing comprises reducing said boron oxide powder into a liquid $^{10}$B oxide suspension.

15. The method of claim 12, wherein the step of processing comprises chemically digesting and precipitating said starting particles to produce said particles of NSM.

16. The method of claim 12, wherein the step of processing includes preparing a solution of said starting particles and methanol and a soluble neutron-converter oxide, wherein the step of filling comprises submerging a portion of said CSP into said solution.

17. The method of claim 11, wherein said starting particles comprise a molecular compound having one or more constituent elements that include a neutron conversion species.

18. The method of claim 11, wherein said particles of NSM comprise a material selected from the group consisting of a chemical solvent and a polymer solution.

19. The method of claim 18, wherein the step of filling comprises spin casting said particles of NSM particles into said space.

20. The method of claim 19, further comprising curing said particles of NSM.

21. The method of claim 11, wherein the step of filling comprises pressing said particles of NSM into said space to produce pressed particles of NSM.

22. The method of claim 21, further comprising adding a stabilizer to said pressed particles.

23. The method of claim 21, wherein said pressed particles comprise organic micro-beads.

24. The method of claim 21, wherein said particles of NSM comprise thermoplastic nanoparticles, the method further comprising heating said pressed particles to reflow said thermoplastic nanoparticles thus stabilizing said pressed particles.

25. The method of claim 11, further comprising sintering said pressed particles.

26. The method of claim 11, wherein said space between each extending portion is selected from the group consisting of (i) less than 5 μm and (ii) about 2 μm.

27. The method of claim 11, wherein said space between each extending portion is less than 5 μm.

28. The method of claim 11, wherein said extending portions are selected from the group consisting of pillars and ridges.

29. The method of claim 11, further comprising providing a first electrode in contact with said extending portions, the method further comprising providing a second electrode in contact with the one of said first side or said second side that is on a side opposite of said intrinsic layer with respect to said first electrode.

30. The method of claim 11, wherein said extending portions comprise a pitch selected from a group consisting of (i) within a range from 1 μm to about 3 μm and (ii) about 2 μm.

* * * * *